United States Patent
Bhattacharyya

(10) Patent No.: US 11,211,124 B2
(45) Date of Patent: *Dec. 28, 2021

(54) MULTIFUNCTIONAL MEMORY CELLS

(71) Applicant: Micron Technology, Inc., Boise, ID (US)

(72) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/205,135

(22) Filed: Mar. 18, 2021

(65) Prior Publication Data

US 2021/0225446 A1 Jul. 22, 2021

Related U.S. Application Data

(63) Continuation of application No. 16/744,388, filed on Jan. 16, 2020, now Pat. No. 10,957,389, which is a
(Continued)

(51) Int. Cl.
*G11C 11/34* (2006.01)
*G11C 14/00* (2006.01)
(Continued)

(52) U.S. Cl.
CPC ...... *G11C 14/0018* (2013.01); *H01L 27/1157* (2013.01); *H01L 27/11582* (2013.01);
(Continued)

(58) Field of Classification Search
CPC . G11C 14/0018; G11C 16/0466; G11C 16/10; H01L 29/42348; H01L 29/7923; H01L 27/1157; H01L 27/11582
(Continued)

(56) References Cited

U.S. PATENT DOCUMENTS 4,870,470 A 9/1989 Bass et al.
6,743,681 B2 6/2004 Bhattacharyya
(Continued)

OTHER PUBLICATIONS

Aoyama et al., "Proposal of New HfSiON CMOS Fabrication Process (HAMDAMA) for Low Standby Power Device", IEEE International Electron Devices Meeting (IEDM) 2004, Dec. 13-15, 2004, San Francisco, CA, pp. 95-98.
(Continued)

*Primary Examiner* — Hoai V Ho
*Assistant Examiner* — Minh Dinh
(74) *Attorney, Agent, or Firm* — Brooks, Cameron & Huebsch, PLLC

(57) ABSTRACT

The present disclosure includes multifunctional memory cells. A number of embodiments include a gate element, a charge transport element, a first charge storage element configured to store a first charge transported from the gate element and through the charge transport element, wherein the first charge storage element includes a nitride material, and a second charge storage element configured to store a second charge transported from the gate element and through the charge transport element, wherein the second charge storage element includes a gallium nitride material.

20 Claims, 6 Drawing Sheets

Related U.S. Application Data continuation of application No. 16/134,603, filed on Sep. 18, 2018, now Pat. No. 10,546,639, which is a continuation of application No. 15/641,736, filed on Jul. 5, 2017, now Pat. No. 10,176,870.

(51) Int. Cl.

| | | |
|---|---|---|
| *H01L 27/1157* | (2017.01) | |
| *H01L 27/11582* | (2017.01) | |
| *H01L 29/792* | (2006.01) | |
| *H01L 29/423* | (2006.01) | |
| *G11C 16/04* | (2006.01) | |
| *G11C 16/10* | (2006.01) | |

(52) U.S. Cl.
CPC .... *H01L 29/42348* (2013.01); *H01L 29/7923* (2013.01); *G11C 16/0466* (2013.01); *G11C 16/10* (2013.01)

(58) Field of Classification Search
USPC ..................................................... 365/185.16
See application file for complete search history.

(56) References Cited

U.S. PATENT DOCUMENTS

| | | | |
|---|---|---|---|
| 6,743,682 | B2 | 6/2004 | Woerlee et al. |
| 6,888,200 | B2 | 5/2005 | Bhattacharyya |
| 6,888,755 | B2 | 5/2005 | Harari |
| 6,903,969 | B2 | 6/2005 | Bhattacharyya |
| 6,917,078 | B2 | 7/2005 | Bhattacharyya |
| 6,998,667 | B2 | 2/2006 | Bhattacharyya |
| 7,012,297 | B2 | 3/2006 | Bhattacharyya |
| 7,042,027 | B2 | 5/2006 | Bhattacharyya |
| 7,130,216 | B2 | 10/2006 | Bhattacharyya |
| 7,145,186 | B2 | 12/2006 | Bhattacharyya |
| 7,158,410 | B2 | 1/2007 | Bhattacharyya et al. |
| 7,166,888 | B2 | 1/2007 | Bhattacharyya |
| 7,184,312 | B2 | 2/2007 | Bhattacharyya |
| 7,208,793 | B2 | 4/2007 | Bhattacharyya |
| 7,224,002 | B2 | 5/2007 | Bhattacharyya |
| 7,244,981 | B2 | 7/2007 | Bhattacharyya |
| 7,250,628 | B2 | 7/2007 | Bhattacharyya |
| 7,273,784 | B2 | 9/2007 | Bhattacharyya |
| 7,276,760 | B2 | 10/2007 | Bhattacharyya |
| 7,279,740 | B2 | 10/2007 | Bhattacharyya et al. |
| 7,294,547 | B1 | 11/2007 | Orimoto et al. |
| 7,339,239 | B2 | 3/2008 | Forbes |
| 7,339,830 | B2 | 3/2008 | Bhattacharyya |
| 7,349,252 | B2 | 3/2008 | Bhattacharyya et al. |
| 7,365,388 | B2 | 4/2008 | Bhattacharyya |
| 7,379,336 | B2 | 5/2008 | Bhattacharyya et al. |
| 7,385,245 | B2 | 6/2008 | Bhattacharyya |
| 7,400,012 | B2 | 7/2008 | Bhattacharyya |
| 7,403,416 | B2 | 7/2008 | Bhattacharyya et al. |
| 7,417,893 | B2 | 8/2008 | Bhattacharyya et al. |
| 7,429,767 | B2 | 9/2008 | Bhattacharyya |
| 7,432,562 | B2 | 10/2008 | Bhattacharyya |
| 7,436,018 | B2 | 10/2008 | Bhattacharyya |
| 7,440,310 | B2 | 10/2008 | Bhattacharyya |
| 7,440,317 | B2 | 10/2008 | Bhattacharyya |
| 7,456,054 | B2 | 11/2008 | Bhattacharyya |
| 7,457,159 | B2 | 11/2008 | Bhattacharyya et al. |
| 7,459,740 | B2 | 12/2008 | Bhattacharyya et al. |
| 7,476,927 | B2 | 1/2009 | Bhattacharyya |
| 7,482,651 | B2 | 1/2009 | Bhattacharyya |
| 7,485,513 | B2 | 2/2009 | Bhattacharyya |
| 7,525,149 | B2 | 4/2009 | Bhattacharyya et al. |
| 7,528,043 | B2 | 5/2009 | Bhattacharyya |
| 7,544,990 | B2 | 6/2009 | Bhattacharyya |
| 7,553,735 | B2 | 6/2009 | Bhattacharyya |
| 7,579,242 | B2 | 8/2009 | Bhattacharyya |
| 7,612,403 | B2 | 11/2009 | Bhattacharyya |
| 7,625,803 | B2 | 12/2009 | Bhattacharyya |
| 7,629,641 | B2 | 12/2009 | Bhattacharyya |
| 7,662,693 | B2 | 2/2010 | Bhattacharyya |
| 7,671,407 | B2 | 3/2010 | Bhattacharyya |
| 7,728,350 | B2 | 6/2010 | Bhattacharyya |
| 7,749,848 | B2 | 7/2010 | Bhattacharyya et al. |
| 7,750,395 | B2 | 7/2010 | Bhattacharyya |
| 7,759,715 | B2 | 7/2010 | Bhattacharyya |
| 7,768,062 | B2 | 8/2010 | Bhattacharyya et al. |
| 7,786,516 | B2 | 8/2010 | Bhattacharyya |
| 7,838,362 | B2 | 11/2010 | Bhattacharyya |
| 7,851,827 | B2 | 12/2010 | Bhattacharyya |
| 7,867,850 | B2 | 1/2011 | Bhattacharyya |
| 7,898,022 | B2 | 3/2011 | Bhattacharyya |
| 7,956,426 | B2 | 6/2011 | Bhattacharyya |
| 7,964,909 | B2 | 6/2011 | Bhattacharyya |
| 7,968,402 | B2 | 6/2011 | Bhattacharyya |
| 8,058,118 | B2 | 11/2011 | Bhattacharyya |
| 8,063,436 | B2 | 11/2011 | Bhattacharyya |
| 8,125,003 | B2 | 2/2012 | Bhattacharyya |
| 8,143,657 | B2 | 3/2012 | Bhattacharyya |
| 8,159,875 | B2 | 4/2012 | Bhattacharyya |
| 8,193,568 | B2 | 6/2012 | Bhattacharyya |
| 8,228,743 | B2 | 7/2012 | Min et al. |
| 8,242,554 | B2 | 8/2012 | Bhattacharyya |
| 8,467,243 | B1 | 6/2013 | Shakeri |
| 9,666,267 | B2 | 5/2017 | Cai |
| 10,176,870 | B1 * | 1/2019 | Bhattacharyya ........................... H01L 27/11582 |
| 10,262,736 | B2 | 4/2019 | Bhattacharyya |
| 10,541,027 | B2 | 1/2020 | Bhattacharyya |
| 10,546,639 | B2 * | 1/2020 | Bhattacharyya ... G11C 14/0018 |
| 10,957,389 | B2 * | 3/2021 | Bhattacharyya .... H01L 27/1157 |
| 2002/0187610 | A1 | 12/2002 | Furukawa et al. |
| 2007/0034922 | A1 | 2/2007 | Bhattacharyya |
| 2007/0045706 | A1 | 3/2007 | Bhattacharyya et al. |
| 2007/0132010 | A1 | 6/2007 | Bhattacharyya |
| 2008/0303080 | A1 | 12/2008 | Bhattacharyya |
| 2009/0108331 | A1 | 4/2009 | Lai |
| 2009/0180324 | A1 | 7/2009 | Ramaswamy et al. |
| 2010/0090265 | A1 | 4/2010 | Bhattacharyya et al. |
| 2012/0217561 | A1 | 8/2012 | Khakifirooz |
| 2019/0198631 | A1 | 6/2019 | Bhattacharyya |

OTHER PUBLICATIONS

Bhattacharyya et al., "Properties and Applications of Silicon Oxynitride Films", from IBM Technical Report TR. 19.0399, presented at the Electrochemical Society (ECS) 150th Meeting, Oct. 1976, Las Vegas, NV, 20 pages.

Buchanan et al., 80 nm polysilicon gated n-FETs with ultra-thin Al2O3 gate dielectric for ULSI applications, IEEE International Electron Devices Meeting (IEDM) 2000, Dec. 10-13, 2000, San Francisco, CA, pp. 223-226.

Buckley et al., "In-depth Investigation of Hf-based High-k Dielectrics as Storage Layer of Charge Trap NVMs", IEEE International Electron Devices Meeting (IEDM) 2006, Dec. 11-13, 2006, San Francisco, CA, pp. 251-254.

Choi et al., "High Speed Flash Memory and 1T-DRAM on Dopant Segregated Schottky Barrier (DSSB) FinFET SONOS Device for Multi-functional SoC Applications", IEEE International Electron Devices Meeting (IEDM) 2008, Dec. 15-17, 2008, San Francisco, CA, 4 pages.

Dillon et al., "Hybrid Memory combining SRAM and NOR Flash for Code and Data Storage", Flash Memory Summit 2012, Aug. 7-9, 2012, Santa Clara, CA, 18 pages.

Han et al., "A Unified-RAM (URAM) Cell for Multi-Functioning Capacitorless DRAM and NVM", IEEE International Electron Devices Meeting (IEDM) 2007, Dec. 10-12, 2007, Washington D.C., pp. 929-932.

Huang et al., "45nm High-K Metal Gate CMOS Technology for GPU/NPU Applications with Highest PFET Performance", IEEE International Electron Devices Meeting (IEDM) 2007, Dec. 10-12, 2007, Washington D.C., pp. 285-288.

Jung et al., "Three-Dimensionally Stacked NAND Flash Memory Technology Using Stacking Single Crystal Si Layers on ILD and

(56) References Cited

OTHER PUBLICATIONS

TANOS Structure for Beyond 30nm Node", IEEE International Electron Devices Meeting (IEDM) 2006, Dec. 11-13, 2006, San Francisco, CA, pp. 37-40.

Kim et al., "Systematic Study of Workfunction Engineering and Scavenging Effect Using NiSi Alloy FUSI Metal Gates with Advanced Gate Stacks", IEEE International Electron Devices Meeting (IEDM) 2005, Dec. 5-7, 2005, Washington D.C., pp. 657-660.

Kim et al., "Robust Multi-bit Programmable Flash Memory Using a Resonant Tunnel Barrier", IEEE International Electron Devices Meeting (IEDM) 2005, Dec. 5-7, 2005, Washington D.C., pp. 881-884.

Krishnan et al., "A Manufacturable Dual Channel (Si and SiGe) High-K Metal Gate CMOS Technology with Multiple Oxides for High Performance and Low Power Applications", IEEE International Electron Devices Meeting (IEDM) 2011, Dec. 5-7, 2011, Washington, D.C., pp. 634-637.

Kubicek et al., ".Low Vt CMOS Using Doped Hf-based Oxides, TaC-based Metals and Laser-only Anneal", IEEE International Electron Devices Meeting (IEDM) 2007, Dec. 10-12, 2007, Washington D.C., pp. 49-52.

Lai et al., "A Multi-Layer Stackable Thin-Film Transistor (TFT) NAND-Type Flash Memory", IEEE International Electron Devices Meeting (IEDM) 2006, Dec. 11-13, 2006, San Francisco, CA, 4 pages.

Lauwers et al., "CMOS Integration of Dual Work Function Phase Controlled NI FUSI with Simultaneous Silicidation of NMOS (NiSi) and PMOS (Ni-rich silicide) Gates on HfSiON", IEEE International Electron Devices Meeting (IEDM) 2005, Dec. 5-7, 2005, Washington, D.C., pp. 661-664.

Lee et al., Effect of Polysilicon Gate on the Flatband Voltage Shift and Mobility Degradation for ALD-Al2O3 Gate Dielectric, IEEE International Electron Devices Meeting (IEDM) 2000, Dec. 10-13, 2000, San Francisco, CA, pp. 645-648.

Lue et al., "A Novel P-Channel NAND-type Flash Memory with 2 bit/cell Operation and High Programming Throughput (>20 Mb/sec)", IEEE International Electron Devices Meeting (IEDM) 2005, Dec. 5-7, 2005, Washington, D.C., 4 pages.

Lue et al., "Scaling Feasibility of Planar Thin Floating Gate (FG) NAND Flash Devices and Size Effect Challenges beyond 20nm", IEEE International Electron Devices Meeting (IEDM) 2011, Dec. 5-7, 2011, Washington, D.C., pp. 203-206.

Luo et al., "Design of High Performance PFETs with Strained Si Channel and Laser Anneal", IEEE International Electron Devices Meeting (IEDM) 2005, Dec. 5-7, 2005, Washington D.C., pp. 495-498.

Manchanda et al., "Gate Quality Doped High K films for CMOS beyond 100 nm: 3-10nm Al2O3 with Low Leakage and Low Interface States", IEEE International Electron Devices Meeting (IEDM) 1998, Dec. 6-9, 1998, San Francisco, CA, pp. 605-608.

Manchanda et al., "Si-Doped Aluminates for High Temperature Metal-Gate CMOS: Zr—AlSi—O, a Novel Gate Dielectric for Low Power Applications", IEEE International Electron Devices Meeting (IEDM) 2000, Dec. 10-13, 2000, San Francisco, CA, pp. 23-26.

Mayuzumi et al., "Extreme High Performance n- and p-MOSFETs Boosted by Dual-Metal/High-k Gate Damascene Process using Top-Cut Dual Stress Liners on (100) Substrates" IEEE International Electron Devices Meeting (IEDM) 2007, Dec. 10-12, 2007, Washington D.C., pp. 293-296.

Moon et al., "Multi-Functional Universal Device using a Band-Engineered Vertical Structure", IEEE International Electron Devices Meeting (IEDM) 2011, Dec. 5-7, 2011, Washington D.C., pp. 551-554.

Nemati et al., "A Novel Thyristor-based SRAM Cell (T-RAM) for High-Speed, Low-Voltage, Giga-scale Memories", IEEE International Electron Devices Meeting (IEDM) 1999, Dec. 5-8, 1999, Washington D.C., pp. 283-286.

Oh et al., "4-bit Double SONOS Memories (DSMs) Using Single-Level and Multi-Level Cell Schemes", IEEE International Electron Devices Meeting (IEDM) 2006, Dec. 11-13, 2006, San Francisco, CA, pp. 967-970.

Ohba et al., "35 nm Floating Gate Planar MOSFET Memory using Double Junction Tunneling", IEEE International Electron Devices Meeting (IEDM) 2005, Dec. 5-7, 2005, Washington D.C., 4 pages.

Ohba et al., "25 nm Planar Bulk SONOS-type Memory with Double Tunnel Junction", IEEE International Electron Devices Meeting (IEDM) 2006, Dec. 11-13, 2006, San Francisco, CA, pp. 959-962.

Ohta et al., "High performance Sub-40 nm Bulk CMOS with Dopant Confinement Layer (DCL) Techniques as a Strain Booster", IEEE International Electron Devices Meeting (IEDM) 2007, Dec. 10-12, 2007, Washington D.C., pp. 289-292.

Ranica et al., "A new 40-nm SONOS Structure Based on Backside Trapping for Nanoscale Memories", IEEE Transactions on Nanotechnology, vol. 4, Issue No. 5, Sep. 2005, pp. 581-587.

Sarkar et al., "Dual Floating Gate Unified Memory MOSFET With Simultaneous Dynamic and Non-Volatile Operation", IEEE Electron Device Letters, vol. 35, Issue No. 1, Jan. 2014, pp. 48-50.

Taguchi, "NOR Flash Memory Technology", presented at 2006 IEEE International Electron Devices Meeting (IEDM) Short Course on Memory Technologies for 45nm and Beyond, Dec. 2006, 27 pages.

Wang et al., "Fast Erasing and Highly Reliable MONOS Type Memory with HfO2 High-k Trapping Layer and Si3N4/SiO2 Tunneling Stack", IEEE International Electron Devices Meeting (IEDM) 2006, Dec. 11-13, 2006, San Francisco, CA, pp. 971-974.

Whang et al., "Novel 3D Dual Control-Gate with Surrounding Floating-Gate (DC-SF) NAND Flash Cell for 1Tb File Storage Application", IEEE International Electron Devices Meeting (IEDM) 2010, Dec. 6-8, 2010, San Francisco, CA, pp. 668-671.

Yu et al., "Advanced MOSFETs Using HfTaON/SiO2 Gate Dielectric and TaN Metal Gate with Excellent Performance for Low Standby Power Applications", IEEE International Electron Devices Meeting (IEDM) 2005, Dec. 5-7, 2005, Washington, D.C., pp. 31-34.

Zhang et al., Novel ZrO2/Si3N4 Dual Charge Storage Layer to Form Step-up Potential Wells for Highly Reliable Multi-level Cell Application, IEEE International Electron Devices Meeting (IEDM) 2007, Dec. 10-12, 2005, Washington D.C., pp. 83-86.

Likharev, "Riding the Crest of a New Wave in Memory", IEEE Circuits and Devices Magazine, vol. 16, Issue 4, Jul. 2000, pp. 16-21.

Ramaswamy et al., "Engineering a Planar NAND Cell Scalable to 20nm and Beyond", 2013 5th IEEE Memory Workshop, May 26-29, 2013, Monterey, CA, pp. 5-8.

Hubert et al., "A Stacked SONOS Technology, Up to 4 Levels and 6nm Crystalline Nanowires, with Gate-All-Around or Independent Gates (φ-Flash), Suitable for Full 3D Integration", IEEE International Electron Devices Meeting (IEDM) 2009, Dec. 7-9, 2009, Baltimore, MD, 4 pages.

Cho et al., "Observation of Single Electron Tunneling and Ballistic Transport in Twin Silicon Nanowire MOSFETs (TSNWFETs) Fabricated by Top-Down CMOS Process", IEEE International Electron Devices Meeting (IEDM) 2006, Dec. 11-13, 2006, San Francisco, CA, 4 pages.

\* cited by examiner

MULTIFUNCTIONAL MEMORY CELLS

PRIORITY INFORMATION

This application is a Continuation of U.S. application Ser. No. 16/744,388, filed on Jan. 16, 2020, which is a Continuation of U.S. application Ser. No. 16/134,603, filed on Sep. 18, 2018, which issued as U.S. Pat. No. 10,546,639 on Jan. 28, 2020, which is a Continuation of U.S. application Ser. No. 15/641,736, filed Jul. 5, 2017, and issued as U.S. Pat. No. 10,176,870 on Jan. 8, 2019, the contents of which are included herein by reference.

TECHNICAL FIELD

The present disclosure relates generally to semiconductor memory and methods, and more particularly, to multifunctional memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), static random access memory (SRAM), and synchronous dynamic random access memory (SDRAM), among others. Non-volatile memory can provide persistent data by retaining stored data when not powered and can include NROM flash memory, NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile and/or volatile memory may be used in, for example, personal computers, portable memory sticks, solid state drives (SSDs), digital cameras, cellular telephones, portable music players such as MP3 players, and movie players, among other electronic devices.

Memory cells in an array architecture can be programmed to a target (e.g., desired) state. For instance, electric charge can be placed on or removed from the charge storage structure (e.g., floating gate) of a field effect transistor (FET) based memory cell to program the cell to a particular data state. The amount of stored charge on the charge storage structure of an FET-based memory cell can be indicated by a resulting threshold voltage (Vt) state of the cell.

For example, a single level memory cell (SLC) can be programmed to a targeted one of two different data states, which can be represented by the binary units 1 or 0. A binary data state represents 1 bit of data with $2^1$ (e.g., 2) data states. As an additional example, some memory cells can be programmed to a targeted one of more than two data states, such as, for instance, to a targeted four bits of data with $2^4$ (e.g., 16) data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit), and therefore can provide high data storage capacity.

DETAILED DESCRIPTION

Figure 1:
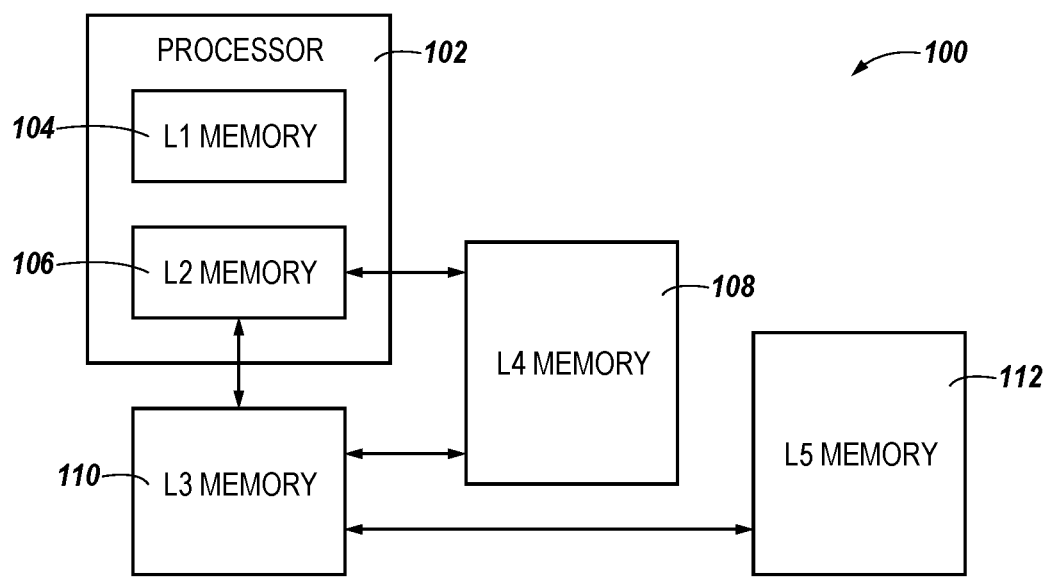
FIG. 1 is a block diagram that illustrates an example of an apparatus in accordance with an embodiment of the present disclosure.

The present disclosure includes multifunctional memory cells. A number of embodiments include a gate element, a charge transport element, a first charge storage element configured to store a first charge transported from the gate element and through the charge transport element, wherein the first charge storage element includes a nitride material, and a second charge storage element configured to store a second charge transported from the gate element and through the charge transport element, wherein the second charge storage element includes a gallium nitride material.

Memory cells in accordance with the present disclosure can have the characteristics (e.g., performance characteristics) and/or attributes of both a less non-volatile (e.g., volatile) memory cell and a non-volatile memory cell within the framework of a single cell. For example, memory cells in accordance with the present disclosure can simultaneously function (e.g., operate) as both less non-volatile and non-volatile memory cells. Such memory cells can be referred to herein as multifunctional memory cells.

Multifunctional memory cells in accordance with the present disclosure can be used to functionally replace traditional memory cells, such as traditional SRAM, DRAM, and/or flash (e.g., NROM and/or NAND flash) memory cells, used in previous memory devices. For example, multifunctional memory cells in accordance with the present disclosure can have a single memory cell design that can be utilized in a single memory array and single logic circuitry design, while simultaneously meeting the performance characteristics and/or attributes of traditional SRAM, DRAM, and/or flash memory arrays previously provided through different cell, array, and logic circuitry designs.

For example, multifunctional memory cells in accordance with the present disclosure can function as high speed memory, such as, for instance, for caching and/or for storage of central processing (e.g., CPU) functions, while simultaneously functioning as high capacity memory, such as, for instance, for working memory storage and/or for large capacity file storage (e.g., for operating systems and/or apps). In contrast, previous memory devices may utilize different types of volatile and non-volatile memory cells, with different array and logic circuitry designs, to achieve such functionality. For instance, previous memory devices may utilize SRAM and/or DRAM cells for higher speed functionality, while utilizing flash memory cells for long-duration (e.g., file) storage functionality.

As such, memory devices that utilize multifunctional memory cells in accordance with the present disclosure can have a lower cost, consume less power, and/or have a higher performance than previous memory devices that utilize different types of memory cells to separately achieve volatile and non-volatile functionality. Further, multifunctional memory cells in accordance with the present disclosure can be multilevel cells (MLCs), thereby achieving high storage density and/or capacity. Further, multifunctional memory cells in accordance with the present disclosure can be configured in planar arrays (e.g., planar channel FET-based) that may be vertically stackable in a three-dimensional memory array and/or alternatively may be configured in vertical planes (e.g., vertical channel FET based) in the form of three-dimensional memory arrays.

In multifunctional memory cells in accordance with the present disclosure, the charges (e.g., electrons) used to program the cell to its various states may originate primarily from (e.g., be supplied by) the metal gate of the cell (e.g., instead of from the semiconductor silicon substrate of the cell, as with other multifunctional memory cells), such that little or no electronic charge movement takes place across the interface between the silicon substrate and the gate insulator stack of the cell. Such memory cells may be referred to herein as reverse mode multifunctional memory cells. Although reverse mode multifunctional memory cells may be comparatively slower in the establishment of their memory states than other non-volatile memory (NVM) cells, they may provide superior reliability since the silicon-insulator interface of the cell remains relatively unperturbed during programming and/or erasing.

Reverse mode multifunctional memory cells in accordance with the present disclosure may have enhanced attributes not available in convention NVM cells. For example, the multi-layered higher K dielectric materials of the cells may be designed to enable 1) energy efficient charge transport using quantum mechanical direct tunneling, thereby achieving end of life programmability and durability; 2) band engineering for high speed charge transport as well as charge blocking for leakage prevention, thereby simultaneously achieving higher performance (e.g., functionality), larger memory window (e.g. MLC capability), and retention (e.g., non-volatility); and 3) effective charge trapping and storage for aiding simultaneously functionality, MLC capability, and non-volatility. Further, reverse mode multifunctional memory cells in accordance with the present disclosure may be technology and integration compatible to scaled CMOS logic technology in a unified fabrication scheme.

Reverse mode multifunctional memory cells in accordance with the present disclosure may also overcome conventional NVM cell limitations through stack designs and the above listed attributes, with further advancement of reliability and durability. It should also be noted that these stacks are directly compatible in an integration scheme with CMOS logic FET gates, and are also implementable in conventional one-transistor, and/or 1.5 Transistor (e.g., split-channel) NROM cells with VGA array scheme, as well as in conventional NAND-Flash array designs.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits.

FIG. 1 is a block diagram that illustrates an example of an apparatus in the form of an electronic system 100 in accordance with an embodiment of the present disclosure. System 100 can be, for example, a computer system, a memory system, a hand-held device, a cell phone, etc. FIG. 1 illustrates an example of a memory hierarchy associated with electronic system 100. In this example, the memory hierarchy may include levels L1 to L5. As an example, levels L1 to L5 may be defined by memory characteristics (e.g., access speed, and/or cycle speed, and or the data throughput, memory cell size, reliability, endurance, volatility, memory-window size, etc.). For example, in going from level L1 to level L5, the access speed, and the cycle speed, and the data throughput may progressively decrease, while the nonvolatility and storage capacity of the memory type may increase.

Note that the data access speed, for example, may be related to the read access time of the memory that implies the time it takes to ensure the binary ("1" or "0") state of any particular memory bit within a memory array (e.g., the higher the access speed, the lower the access time). For example, the cycle time may imply the time it takes to not only establish the binary memory state of any storage bit (either 1, or 0) through programming ("write" and or "erase") of the specific bit within the memory array, but also the time to ensure the memory state which is the access time. Memory delay (e.g., memory latency) may imply the time it takes for the memory bit to arrive at the processor node once the processor fetches the memory bit triggered by a unit of a clock cycle of the processor, for example. Memory bandwidth (e.g., memory throughput), for example, may be related and inversely proportional to the memory latency. The higher the memory bandwidth, for example, the lower the delay and lower the memory cycle time. For example, the data throughput may be inversely related to the data cycle time combined with the data transfer time to the processor, where the data transfer time to the processor may be dependent on the design of the memory output system and the transfer mode. Therefore, when memory with lower latency (e.g., a lower cycle time) may be employed, for example, the processor may execute an assigned task (e.g. any specific function or program) faster and the performance of a system (e.g., digital system) may be improved.

Memory volatility may be related to two aspects of retention of the memory state of any memory bit. One aspect of retention may be the retention of a memory state when the power is available to the memory array, implying that no re-writing (e.g., refreshing), such as re-establishing, the memory state is required during a time period. This aspect of retention may be longer for SRAM and shorter (in the order of milliseconds) for DRAM. Therefore, DRAM may require frequent refreshing of a memory state even when the power is on for the memory array. The other aspect of memory retention, for example, may be the ability to retain a written (e.g., established) memory state of any bit when there is no power to the memory array. Memory state retention of this type might be about 10 years for some nonvolatile memories of some SSDs (NROMs or NAND types of memory cells) and HDDs (magnetic tapes or disks).

When power is not available, for example, the memory states of SRAMs and DRAMs may be lost. Therefore, these types of memories may be classified as volatile memories. For conventional non-volatile memories, for example, the lower the degree of volatility, the longer the memory retains data, and thus the greater the retention. For example, SDDs may, in general, be less nonvolatile compared to HDDs, where HDDs could retain data for centuries in a properly stored environment. Silicon-based non-volatile memories may vary significantly in memory retention, depending on the memory type (NROM or NAND Flash), the memory cell attributes, and the detailed stack structure of the memory cell design. Some memory cell designs of NROMs and NAND, for example, may have at least one year of nonvolatility for most of the applications for which such memories are employed.

For multifunctional non-volatile memories in accordance with the present disclosure that retain their memory states when power is lost, the degree of non-volatility may vary by many orders of magnitude, and may depend on the cycle time of the specific memory cell to functionally replace the conventional memory cells. Multifunctional memory cells in accordance with the present disclosure are based on charge trapping elements integrated into a gate stack insulator structure within the framework of an FET-based cell. For instance, a multifunctional memory cell in accordance with the present disclosure designed to replace simultaneously an L3 (conventional DRAM) functionality and L5 (HDD) functionality may be designed to store memory states within the cell for 1E2 seconds and 1E9 seconds (e.g., nearly 50 years) for L3 and L5 functionality simultaneously, even when there is no power to the memory cell. In similar cases, conventional DRAM volatile memory will not hold memory states when power is lost, but HDD will maintain its state.

Another important property of memory, for example, may be the number of times memory binary states may be "written" or altered or "programmed" during the life time of the electronic system. In some examples, systems, such as memory systems, may be assumed to last for about 10 years, during which some memory bits may be altered for as many as thousand trillion times (1E15 times). The SRAMs and DRAMs, might, for example, withstand such re-programming known as "endurance." Endurance limits of some NROMs, for example, may be about 10 million times, while those of some NAND flash memories may be about 100,000 times to about one million times. This may limit the application of current NROMs and NANDs for L1, L2, and L3 memory applications, besides their significantly slower cycle time compared to SRAMs and DRAMs.

Electronic system 100 may include a processor 102, such as a microprocessor, that may control electronic system 100. Processor 102 may include a memory 104, such as a logic memory, having a memory level L1. For example, a conventional L1-level memory may be an SRAM volatile memory. Processor 102 may also include a memory 106, such as a cache memory, that may have a memory level L2, for example. In some examples, processor 102 may include a built-in memory management unit (MMU) not shown in the drawing. In some examples, the MMU (not shown) may be coupled to L2 and other memory levels. An example of a conventional L2-level memory may be an SRAM volatile cache memory.

Advantages of SRAM may include, for example, high performance (e.g., high data throughput), and high endurance required for L1/L2-level functionality, and ease of fabrication (e.g., that may be compatible with complementary-metal-oxide-semiconductor (CMOS) fabrication techniques). Disadvantages of SRAM may include, limiting memory capacity, due, for example, to relatively large memory cell sizes (e.g., with a form factor F×F of about 50 to about 80) and volatility.

Memory 106 may be coupled to a memory 108, as shown in FIG. 1. Memory 106 may also be coupled to a memory 110, and memory 110 may be coupled to memory 108, for example. As used in the examples herein, the term "coupled" may include directly coupled and/or directly connected with no intervening elements (e.g., by direct physical contact) or indirectly coupled and/or connected with intervening elements, such as an MMU (not shown).

Memory 110 may be a main memory (e.g., a working memory) and may have a memory level L3. An example of a conventional L3-level memory may be a DRAM volatile memory. Advantages of DRAM, for example, may include relatively higher performance compared to non-volatile memories (e.g., read, write, and erase times of less than about 10 nanoseconds), relatively small (e.g., an F×F of about 6 to about 8) one-transistor-one-capacitor memory cells, yielding higher capacity, and relatively higher performance with lower cycle time to provide L3-level functionality. DRAM, for example, may provide relatively high endurance at the expense of power consumption for frequent refreshing of the memory states. Disadvantages of DRAM may include, for example, fabrication (e.g., customized CMOS fabrication for the capacitor may be required), scalability (e.g., may be difficult to scale to below 30 nanometers), and volatile memory cells (e.g., data may need to be refreshed about every millisecond).

Memory 108 may be a storage memory (e.g., for storing data and/or code) and may have a memory level L4. Examples of L4-level memory may include non-volatile NOR memory, non-volatile NAND memory, and non-volatile NROM. In some examples, memory 108 may be referred to as a solid-state memory.

Advantages of NROM (e.g., NROM flash) may include, for example, relatively high read performance (e.g., fast reads), non-volatile memory cells, relatively small (e.g., an F×F of about 6) random-access-one-transistor memory cells, multiple-bit-per cell storage capability, basic-input/output-system (BIOS) functionality, code storage capability, and fabrication (e.g., compatible with CMOS fabrication techniques). Disadvantages of NROM may include, for example, relatively slow writes, relatively high programming voltages, relatively low read/write endurance, and relatively poor durability.

Advantages of NAND (e.g., NAND flash) may include, for example, small (e.g., an F×F of about 4) one-transistor memory cells with single-bit- and multiple-bit-per cell storage capability, non-volatile memory cells, and high storage capacity per $mm^2$ of silicon. Disadvantages of NAND may include, for example, relatively slow write speeds (e.g., about 1.0 to about 10 millisecond), relatively slow access (e.g., serial/parallel memory access), and relatively low write/erase (W/E) endurance (e.g., about $10^3$ to about $10^5$ W/E cycles).

Memory 110 may be coupled to a memory 112, having a memory level L5, for example. Examples of conventional L5-level memories may include magnetic memory (e.g., magnetic tapes) and/or optical memory (e.g., optical discs) for storing data. In some examples, memory 112 may be referred to as an HDD memory. Advantages of magnetic memory may include, for example, non-volatility, high-density storage, low cost, high capacity, and L5-level functionality. Disadvantages of magnetic memory may include, for example, speed (e.g., long access and cycle times), relatively poor reliability, and moving mechanical parts.

A memory hierarchy, such as that described above, may advantageously employ, for example, the memories described above, such as the L1- to L5-level memories (e.g., SRAM, DRAM, NROM, NAND, and HDD) to fulfill system functionality objectives with cost, capability, power, performance, form-factor, portability, and applications in mind. The hierarchy may require communication between various memories and, therefore, for example, may disadvantageously involve a significant amount of peripheral logic, power, cost, performance compromises, form-factor constraints, reliability issues, and durability issues. This, for example, may suggest a "one-type-fits-all" approach to memory design (e.g., a novel one-type-fits-all memory). Except for HDD, some processors and memories may (e.g., all) be silicon based, and the memory cell structure may (e.g., all) be similar and may be built using scaled CMOS field-effect transistor technology, for example.

There may be a need for memories that may include silicon-based non-volatile one-transistor memory cells that may simultaneously satisfy the speed, power, and/or durability requirements of L2-, L3-, and L4-level memories. Such a memory cell may be referred to herein as a multifunctional memory cell. There may be a need to extend the reliability and durability of such a memory cell while preserving other attributes of multifunctional memory cells. Such a memory cell may be referred to herein as a reverse-mode multifunctional memory cell. There may be a need to provide reverse-mode multifunctional memory cells whereby gate stack integration for CMOS scaled logic FETs are made simpler.

There may be a need for memories with multifunctional capability to maintain their information or data when there is a loss of power. There may be a need for memories to simultaneously store the shorter retention data for end-of-life storage within the same memory cell. There may be a need, for example, to do away with the conventional memory hierarchy (e.g., in favor of a non-hierarchical organization) that may result in faster communication with the processor. There may be a need, for example, to have such a memory with integration compatibility with scaled CMOS logic technology and ease of fabrication with a convention processing scheme. Such a memory may be referred to herein as reversed-mode silicon based-unified multifunctional memory, or reverse-mode MSUM memory.

There may also be a need to extend the MSUM memory cell capability to provide higher capacity of data storage within the memory cell in order to achieve MLC capability. There may also be a need for a memory cell to operate in reverse-mode to extend durability. Such a memory cell design may be referred to herein as a reverse-mode MLC MSUM cell.

Embodiments of the present disclosure include memory that may include, for example, non-volatile memory cells in which an active element, such as a field-effect transistor, may be integrated with a dielectric stack that can store a charge in the gate stack of the field-effect transistor. The gate stack may control the entire transistor channel or part of the transistor channel in the memory cell design. In some examples, such a memory might be referred as MSUM. In some examples, the design of the dielectric stack may be varied to incorporate L4 or L5 level MLC storage capacity. Such a memory cell might be referred as MLC MSUM. In some examples, the design of the dielectric stack may be varied so that the non-volatile memory cell (e.g., a MSUM memory cell) may operate simultaneously as a L2-, L3-, L4-, or L5-level memory cell. For example, the memory cells disclosed herein may have higher performance, lower power consumption, and higher reliability than, for example, some conventional NVM cells. Employing such a memory cell in the framework of sub-arrays and arrays may eliminate the need of conventional memory hierarchy, thereby improving memory and system attributes.

In some examples, field-effect-transistor- (e.g., FET-) based reverse-mode MSUM devices in accordance with the present disclosure may be designed to achieve different functionality, dependent on intrinsic dielectric stack characteristics of a design, by adding or subtracting dielectrics in the dielectric stack. Reverse-mode MSUM technology may be seamlessly integrated with the CMOS logic technology, for example, unlike conventional memories, such as DRAM, that may have unique customized integration requirements. MSUMs may be differentiated by the attributes of their charge transport, charge storage, and charge retention (e.g., charge blocking) characteristics. For example, the intrinsic memory-cell attributes may be different in terms of programming speed, power, and refresh requirements that may result in cycle-time variations, variations in data throughput and system capability, and differing applicability to replace conventional memories by functionality.

In some examples, some reverse-mode MSUM memory cells in accordance with the present disclosure may have a programming peak field lower than 8 MV/cm, which may be significantly lower than that for conventional NVMs. Additionally, some reverse-mode MSUM memory cells in accordance with the present disclosure may only require charge injection from the gate during programming, keeping the silicon-insulator interface passive with no energy transfer at the interface during programming of the cell. Consequently, in some examples, memory durability (e.g., programming endurance) could significantly enhance and match those of volatile SRAM and DRAM memories, thereby enabling functional replacements of volatile memories in digital systems not currently feasible by conventional NROMs and NAND flash based SSDs.

Some DRAMs may operate at 1.5 Volts, and may need to be refreshed about every 10 milliseconds. However, some reverse-mode MSUMs in accordance with the present disclosure may need to be refreshed (e.g., reprogrammed) only about every 100 to 1000 seconds. Further, some DRAM memory cells, for instance, may require twice as much area as some reverse-mode MSUMs in accordance with the present disclosure.

In various examples of the present disclosure, reverse-mode MSUM-memory-cell fabrication may be compatible with complementary-metal-oxide-semiconductor (CMOS) fabrication techniques. This may allow, for example, the dielectric stack to be fabricated to a desired memory level (L2, L3, L4, or L5) with a minimal number of additional processing steps. Moreover, the reverse-mode MSUM memory cells may be scalable to about a five-nanometer feature size. For example, such scaling may be difficult for conventional DRAM designs.

Reverse-mode MSUM memory cells in accordance with the present disclosure may be implemented (e.g., in scaled silicon) using, for example, CMOS logic technology and a set of unified and complimentary integration schemes that may eliminate some separate, custom-integration technology practices, such as those currently employed for DRAM (e.g., for L3), and NROM (for code, BIOS, etc.) and NAND-flash (e.g., for L4) memory chips. Additionally, custom interface logic and packaging may be required for communication between the processor and between different levels and technology-specific types of memories within the previous hierarchical memory systems. Reverse-mode MSUM memory cells in accordance with the present disclosure may (e.g., only) add or subtract specific selected dielectrics (e.g., as thin films) in the gate stack design in a unified process integration methodology with the scaled CMOS logic technology to enable functionality equivalence from L2 through L5. This may potentially have, for example, multiple benefits, such as a) technology compatibility, b) productivity, c) enhancement in technology reliability, and d) reduction (e.g., elimination) of interfacing technology and packaging between different memory types and between logic and memories. For example, potential benefits at the system level may include not only process complexity reduction, but also, cost reduction, power reduction, and enhancements in performance, and reliability. Additional potential benefits may include a reduction in test cost and component product assurance cost both at a memory level and a system level.

Multiple and wide-ranging memory cell performance and associated data throughput from the memory array may be built into the same reverse-mode MSUM cell design with complementary Input/Output logic built into the associated memory array. For example, this may be achieved by integrating dielectric films with well-defined intrinsic attributes into the dielectric stack design of an MSUM memory cell while using a similar (e.g., the same) technology integration scheme. This may provide, for example, certain functionality and memory capability within a single memory array design that may not be feasible for conventional memories.

MSUMs, for example, may allow for similar memory cell designs and array architectures throughout the memory hierarchy that may provide a spectrum of cycle time, latency targets, and data throughput to deliver varying functionality and durability requirements that might be balanced for certain applications. Due to the process commonality, MSUM-cell designs might be implemented in different capacity arrays and or subarrays within a single chip or multiple chips to address system cost, power, form-factor, performance, and durability objectives. This may provide more flexibility in system design, for example.

Some reverse-mode MSUM memory cell designs in accordance with the present disclosure, for example, may employ an energy-efficient direct tunneling mechanism to achieve desired system performance and functionality. Some reverse-mode MSUM memory cell designs in accordance with the present disclosure may extend the direct tunnel mechanism further through internal field enhancements using appropriately selected multi-layered direct tunneling dielectric films with progressive band-energy offsets coupled with multi-step direct tunneling. For example, this approach may allow additional voltage scalability with higher programming speed for the memory cells, and, consequently, power savings at the desired performance level, that may be difficult to achieve using conventional memories and hierarchical memory designs of comparable performance and applicability.

Band-engineered reverse-mode MSUM memory cells, for example, may employ stack design and tailored programming to establish targeted speed-retention tradeoffs towards achieving the system data-rate throughput (L2/L3/L4 functionality) for effective execution of functions. For example, this approach may reduce data transmission delays, and thus increase data availability, at appropriate processing nodes, reduce pre-fetch data storage requirements, reduce machine cycle time for execution of functions, reduce data refresh requirements, reduce complexity in bus design, etc.

Reverse-mode MSUM memory cell designs in accordance with the present disclosure may provide, for example, unique sets of functional attributes via dielectric stack designs for FET based charge-trap memory cells. For example, the reverse-mode MSUM memory cell and array design may have the potential to create superior digital systems with flexible design attributes within the framework of a unified technology and memory cell and array designs and yet with versatile functionality to broaden application base not cost-effective with current conventional approaches.

Reverse-mode MSUM memory cell designs in accordance with the present disclosure may provide, for example, unique memory sub-arrays, arrays, and/or sub-systems with specific attributes within the framework of a unified scaled CMOS technology, by incorporating or eliminating certain dielectric layers in the gate stack design of the memory cell. Such versatility may not be available in conventional memory cell and array designs. These memory sub-system attributes for reverse-mode MSUMs with greater durability may include, for example, 1) cost optimized MSUM designs for L2/L3/L4, 2) power optimized MSUM designs for L2/L3/L4, 3) cost and performance optimized MSUM designs for L1/L2/L3/L4, 4) performance optimized (e.g., high performance) MSUM designs for L1/L2/L3/L4, and 5) capacity optimized (e.g., MLS) MSUM designs for L1/L2/L3/L4, plus MLC.

Figure 2A:
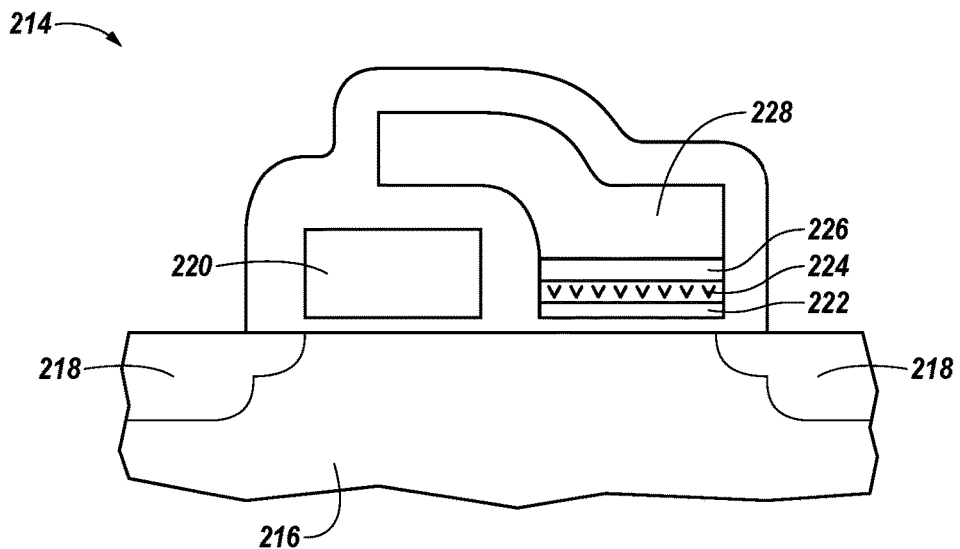
FIG. 2A illustrates a schematic of an NROM memory cell for implementation in a multifunctional memory cell in accordance with an embodiment of the present disclosure.
Figure 2B:
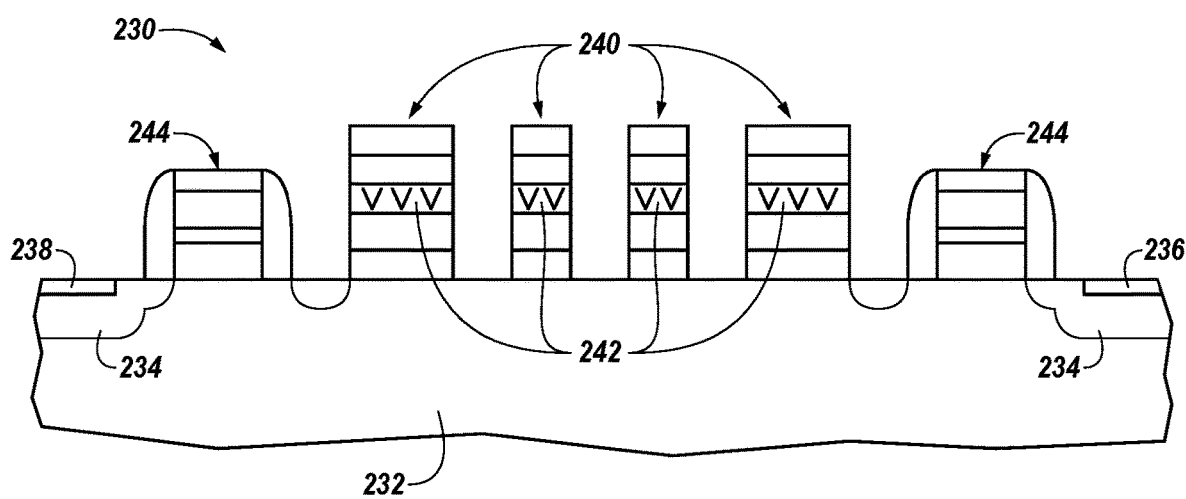
FIG. 2B illustrates a schematic of NAND memory cells for implementation in a multifunctional memory cell in accordance with an embodiment of the present disclosure.

FIG. 2A illustrates a schematic of an NROM memory cell 214 for implementation in a multifunctional memory cell in accordance with an embodiment of the present disclosure. FIG. 2B illustrates a schematic of NAND memory cells 240 for implementation in a multifunctional memory cell in accordance with an embodiment of the present disclosure.

As previously described herein, reverse-mode MSUM cells in accordance with the present disclosure can be implemented in the form of either 1) a two-transistor NROM cell with one fixed Vt transistor in series with an NV-transistor with MSUM characteristics sharing a common diffusion mode, or 2) a split gate (or split channel) implementation of the memory cell of form 1 whereby the fixed Vt element acts as the access gate and is integrated with the variable Vt NVM element which acts the control gate. Together the access gate and control gate can control the channel and set the memory thresholds or the memory states. For instance, the access gate can be designed to set the erase state for the memory cell and perform "over-erasure" protection for the memory, and the control gate can be programmed to define the programmed (e.g., written) states for the cell (e.g., "1" for 1 bit binary state, "01, 10, 11" for a DLC providing 2-bits per cell storage, "001, 010, 100, 110, 101, 011, 111" for a TLC providing 3-bits per cell storage, etc.). The integrated two device memory cell may be referred to herein as a 1.5 T NVM cell.

A schematic of an example configuration of such a cell is illustrated in FIG. 2A. The type of NROM cell illustrated in FIG. 2A can be used for MLC-NROMs because it can provide over-erasure protection and consequently tight distribution of the erase memory state (e.g., "0", "00", or "000" for 1 bit, 2 bit, or 3 bit storage, respectively) for the memory array.

As shown in FIG. 2A, NROM cell 214 may be adjacent to (e.g., over) a semiconductor 216, such as P-type (e.g., P$^-$-doped) silicon substrate. Source/drains 218 (e.g., n$^+$-type or n$^-$-type diffusion regions) may be in semiconductor 216. NROM cell 214 can include a split gate structure (e.g., access gate element 220 and overlapping control gate element 228), and a stack having a charge blocking element 222, charge storage (e.g., trap) element 224, and an interface metallic layer 226, as illustrated in FIG. 2A. Examples of the gate, charge storage element, charge blocking element, and interface layer will be further described herein.

FIG. 2B illustrates a schematic representation of a planar NAND memory string 230, which can be used for high capacity storage. For example, as many as 256 bits could be serially stored within such a NAND string where the bits are accessed serially. The NAND string can provide the highest memory density for all memory cells, at the expense of performance since the memory cells need to be accessed serially within each string.

As shown in FIG. 2B, NAND string 230 can include a number of NAND cells 240 adjacent to (e.g., over) a semiconductor 232, such as P-type (e.g., P$^-$-doped) silicon substrate. Source/drains 234 (e.g., n$^+$-type diffusion regions) may be in semiconductor 216 to form source line 236 and bit line 238, respectively. As illustrated in FIG. 2B, each respective NAND cell 240 can include a stack comprising, among other elements, a charge storage (e.g., trap) element 242, examples of which will be further described herein. Further, NAND string 230 can include a bit line select gate 244 (to select the specific NAND string) on one end and a source-line select gate 244 at the other end adjacent to source/drains 234, as illustrated in FIG. 2B.

Embodiments of the present disclosure, however, are not limited to the specific designs illustrated in FIGS. 2A and 2B. Rather, reverse-mode MSUM concepts in accordance with the present disclosure could be applicable to all types of memory cells previously described herein by incorporating their unique stack designs to provide simultaneous multi-functionality. Further, as previously described herein, all reverse-mode MSUM cells described herein are implementable with common scaled CMOS technology.

In all reverse-mode MSUM cell designs to be described herein, tantalum nitride (TaN) may be used as the metallic interface to the gate to partially control the threshold of the device. Further, in all SUM designs, the equivalent oxide thickness (EOT) of the logic FETs (both PFET and NFET) may be set by the interface dielectric at the substrate end and the final blocking element of the SUM stack at the metal end. The intermetallic TaN material may be chosen to set the work-function for the logic FETs as well as the MSUM devices, and may be common to both logic and memory devices for all cases.

In all reverse-mode MSUM cell designs to be described herein, the simultaneous multi-functionality may be adjusted and simultaneously, the program performance (e.g., cycle) time could be adjusted by optimizing the programming pulse scheme. Although the stack designs described herein may be either cost-focused, power-focused, capacity-focused, performance-focused, or cost/performance-focused designs, the attributes of the designs could be altered and tailored for specific applications by altering the thickness of particular elements (e.g., layers) shown, eliminating particular elements, and/or adding additional (e.g., optional) layers for tunneling, trapping, and/or blocking functions.

Further, reverse-mode MSUM cell designs described herein may include a less non-volatile charge storage element, and a non-volatile charge storage element. As used herein, a "less non-volatile" charge storage element of the multifunctional cell can be a charge storage element that has a functionality level that is lower than the functionality level of the volatile charge storage element of the cell. For example, the less non-volatile charge storage element may have volatile level functionality, and as such may also be referred to as a volatile charge storage element.

The gate stack designs of all reverse-mode MSUM cell designs to be described herein may have a commonality of interface materials (e.g., layers) both at the silicon/insulator interface as well as the gate-insulator/gate-metal interface. The first interface dielectric layer may be an ultra-thin layer of oxygen-rich silicon oxynitride (OR—SiON) to control the interface state density, equivalent to silicon dioxide ($SiO_2$). For the insulator/gate metal interface, a common layer of inter-metallic TaN can be used to control the work function for any logic FET device or SUM memory device.

Further, the gate stack designs of all reverse-mode MSUM cell designs to be described herein may use integration compatible dielectric materials (e.g., layers) for both scaled FET devices and certain elements for non-volatile memory devices. The integration may be straight forward by using, for example, the FET gate insulator processing sequence of combining OR—SiON and a blocking material of, for example, hafnium lanthanum oxynitride (HfLaON), deposited in the defined active regions during processing, which can become sequential and yield the gate insulator stack design for the scaled FET devices. In terms of process integration, this approach may provide a simple integration scheme between the logic and memory devices.

The integration scheme for the gate stack designs of all reverse-mode MSUM cell designs to be described herein may include a charge transport element (e.g., tunnel layers) adjacent the gate, charge trapping and/or storage elements adjacent the charge transport element, and a charge blocking element (e.g., blocking layers) adjacent the charge trapping and/or storage elements and the silicon substrate. This may be a reverse order from other multifunctional memory cells, in which the tunnel layers may be adjacent the silicon substrate and the blocking layers may be adjacent the gate. Accordingly, the active source of charges for reverse-mode memory cells in accordance with the present disclosure may be the gate (e.g., instead of the silicon substrate, as with other multifunctional memory cells), with the silicon-interface remaining passive during programming.

Various embodiments of reverse-mode MSUM memory cells will be further illustrated and described herein. However, embodiments of the present disclosure are not limited to these examples, with other possibilities existing for such cell designs providing simultaneous multiple functionality within the same cell, multi-level storage, and enhanced durability. The illustrated cells may be direct tunnel charge trapping FET-based memory cells, and may be used in NROM VGA array implementations and/or NAND flash array implementations. However, in some embodiments, performance-focused designs may be employed in NROM arrays and capacity-focused designs may be employed in NAND arrays, depending on application objectives.

All reverse-mode MSUM memory cells described herein may operate as direct tunnel memories, and their enhanced attributes can be derived from band engineered gate stack designs employing appropriate properties of high K dielectric materials for tunneling, trapping, storing, and reducing (e.g., minimizing) stored charge losses. All embodiments may exhibit end-of-life endurance with peak fields ≤8.2 MV/cm, which may be significantly below the programming field used for conventional NVMs. The programming voltage may be either +/−5 V or +/−7V, which may be less than half the programming voltage typically employed in conventional NVM devices. Embodiments are designed for a 1.5 V power supply consistent with feature-size scaled technology below 30 nm. The FET EOT for all embodiments may be in the range of 1.8 to 2.3 nm.

For all reverse-mode MSUM memory cells described herein, programming (e.g., writing) may be done by applying a −Vpp on the gate, which injects electron into the gate dielectric layers. Erasing can be accomplished by imposing positive potential to the gate, thereby removing the electrons from the trapping dielectric and returning them back to the gate. Shallower traps may include either a nitride layer or a silicon oxynitride ($Si_2ON_2$) layer. The $Si_2ON_2$ layer may provide longer refresh time for L2 and L3 functionality due to somewhat deeper trapping depth compared to nitride. For L4/L5 functionality, deeper gallium nitride (GaN) trapping can be employed closer to the silicon-insulator interface, which enables larger memory window and longer retention. All programming (e.g., writing and erasing) is done by direct tunneling, enabling end-of life endurance and lower Vpp and consequently a lower energy requirement for programming.

In MLC designs of the present disclosure, a thin layer of aluminum oxide ($Al_2O_3$) and storage layer, injector silicon-rich nitride (i-SRN), adjacent to the $Al_2O_3$ may be introduced to achieve enhanced retention due to creation of fixed negative charges at the $Al_2O_3$/i-SRN interface (due to alumino-silicate formation at the interface). This approach may provide significantly larger window and enhanced retention enabling DLC and TLC capabilities for charges stored in deep offset traps of GaN. For programming flexibility, some cell designs may use multiple thin laminates of shallow (e.g. nitride) and deep traps (e.g. GaN) spaced at successively longer distances. This approach can enable L2/L3/L4 programming performance and memory window design flexibility by utilizing the energetics of trapping and de-trapping.

Figure 3:
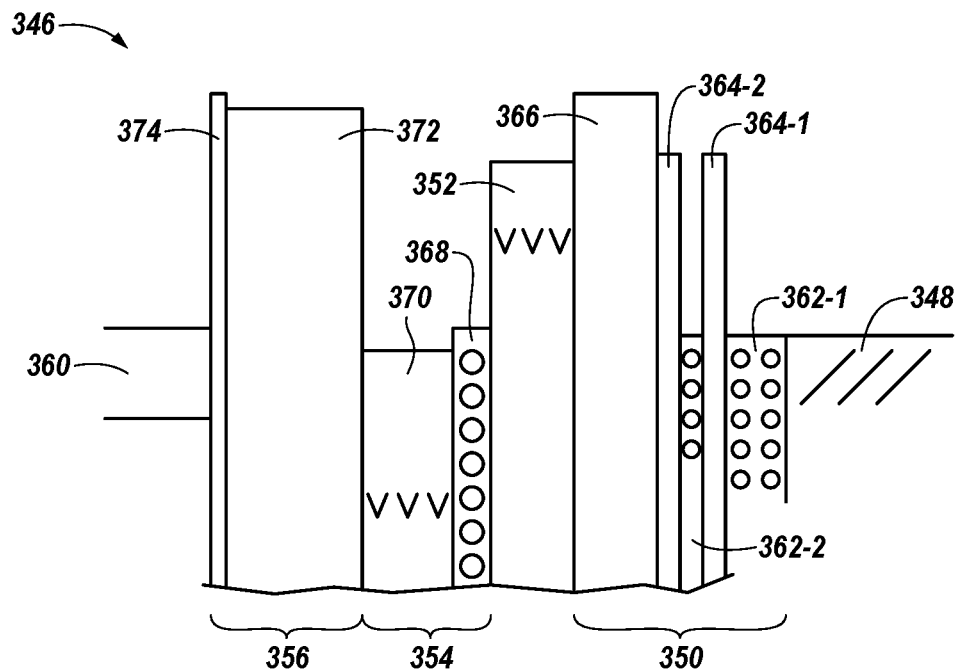
FIG. 3 illustrates a portion of a multifunctional memory cell in accordance with an embodiment of the present disclosure.

FIG. 3 illustrates a portion of a multifunctional memory cell 346 in accordance with an embodiment of the present disclosure, designed for low power, high performance simultaneous L2 and L3 functionality, with optional simultaneous extendibility to L4 functionality. For example, FIG. 3 illustrates a partial energy band diagram of the gate stack structure of a reverse-mode multifunctional memory cell 346. Cell 346 can be, for instance, a five unique layer low power, high performance memory cell that can provide L2 and L3 functionality, while consuming a relatively low amount of power during operation (e.g., during program and/or erase operations performed on the cell). In an embodiment, cell 346 can comprise a stack that includes a charge blocking element having an OR—SiON material and an HfLaON material, a non-volatile charge storage element having a GaN material and an i-SRN material for extended charge storage, a nitride less non-volatile charge storage element, and a charge transport (e.g., tunnel) element having an HfLaON material, a first nitride material, a first i-SRN material, a second nitride material, and a second i-SRN material, as will be described herein.

As shown in FIG. 3, cell 346 can include a substrate element 360, a charge blocking element 356 adjacent (e.g., in direct contact with) substrate element 360, a non-volatile charge storage element 354 adjacent charge blocking element 356, a less non-volatile charge storage element 352 adjacent non-volatile charge storage element 354, a charge transport (e.g., tunneling) element 350 adjacent less non-volatile charge storage element 352, and a gate element 348 adjacent charge transport element 350. Substrate element 360 can be, for example, a silicon material (e.g., a silicon substrate), and gate element 348 can be an insulator-metal interface material (e.g., layer) such as, for instance, tantalum nitride (TaN) or titanium nitride (TiN).

Less non-volatile (e.g., DRAM) charge storage element 352 can be a nitride material, which can provide stability and a large retention window, while having a shallow trap depth to enhance detrapping and increase the speed of erase operations performed on cell 346. Non-volatile (e.g., flash) charge storage element 354 can include a first non-volatile charge storage material 370, and a second non-volatile charge storage material 368, as illustrated in FIG. 3. First material 370 can be a GaN material, which can provide a high trapping density (e.g., greater than $10^{13}$ per square centimeter), and second material 368 can be a silicon-rich nitride material, such as, for instance, an injector silicon-rich nitride material, to further enhance charge storage (e.g., the memory window) for the flash memory functionality. GaN material 370, i-SRN material 368, and nitride material 352, can have thicknesses of 3 nanometers (nm), 2 nm, and 1.5 nm, respectively, with a combined equivalent oxide thickness (EOT) of 2.34 nm.

As shown in FIG. 3, charge blocking element 356 can include a first material 374 and a second material 372. First material 374 can be an OR—SiON material that can provide interface stability with substrate element 360 by controlling the interface state density. As an example, oxygen-rich silicon oxynitride material 374 can be a high-K material having a composition of N/N+O of approximately 0.18 and an atomic concentration of oxygen in the range of 50-60%, and can be fabricated using low-pressure chemical vapor deposition, atomic layer deposition, or thermal/plasma oxidation/nitridation techniques, for instance. Second material 372 can be a thermally stable, low leakage hafnium oxynitride material, such as a hafnium lanthanum oxynitride (HfLaON) material, a hafnium aluminum oxynitride (HfAlON) material, a hafnium tantalum oxynitride (HfTaON) material, or a hafnium silicon oxynitride (HfSiON) material, for instance. Such a material can be a trap free dielectric that has low conductivity and a high-K value that can result in a low equivalent oxide thickness (EOT). Further, such a material can have high thermal and structural stability, and high breakdown strength. OR—SiON material 374 and HfLaON material 372 can have thicknesses of 1 nm and 5 nm, respectively, with a combined EOT of 1.8 nm.

In the example illustrated in FIG. 3, charge transport element 350 includes a first material (e.g., first layer) 366, a second material (e.g., second layer) 364-2, a third material (e.g., third layer) 362-2, a fourth material (e.g., fourth layer) 364-1, and a fifth material (e.g., fifth layer) 362-1. First material 366 can be a hafnium oxynitride material (e.g., the same type of hafnium oxynitride material as material 372), second material 364-2 and fourth material 364-1 can both be a nitride material, and third material 362-2 and fifth material 362-1 can both be a silicon-rich nitride material (e.g., an injector silicon-rich nitride material). The transport of charge through charge transport element 350, and the benefits of utilizing such materials in charge transport element 350, will be further described herein. HfLaON material 366 can have a thickness of 3 nm, nitride materials 364-2 and 364-1 can both have thicknesses of 1 nm, and i-SRN materials 362-2 and 362-1 can both have thicknesses of 2 nm, with a combined EOT of approximately 1.5 nm for charge transport element 350. However, higher performance L2 functionality can be obtained by reducing the thickness of HfLaON material 366 to 1.5-2.0 nm.

The combined total EOT for the stack comprising charge blocking element 356, non-volatile and less non-volatile charge storage elements 354 and 352, and charge transport element 350 can be, for instance, less than or equal to 6.5 nm. This embodiment can be a low power (e.g., Vpp of +/−5 V, peak programming field of 7.7 MV/cm) design, as previously described. Further, all materials of the stack could be deposited with the same low-pressure chemical vapor deposition tool. For integration, the first two materials 374 and 372 (e.g., OR—SiON and HfLaON) can be deposited on active device regions of silicon for both logic and memory devices. Subsequently, the memory regions (e.g., for the deposition of non-volatile and less non-volatile charge storage elements 354 and 352) can be opened while the rest of the silicon remains masked, and all other dielectric materials can be deposited selectively on the active memory cell regions. After the gate stacks are all in place, and source/drain processing are completed, TaN and the metal gate can be deposited over the logic FET device regions and the memory gate regions at the same time.

During operation of cell 346, such as, for instance, during a program operation being performed on cell 346, a charge, such as, for instance, an electron, may be transported from gate element 348 through charge transport element 350 (e.g., through materials 362-1, 364-1, 362-2, 364-2, and 366) to either less non-volatile charge storage element 352 or non-volatile charge storage element 354 (e.g., to GaN material 370). For instance, a program operation performed on cell 346 can include applying a program (e.g., write) voltage (+/−Vpp) to cell 346, and whether the charge is transported to less non-volatile charge storage element 352 or non-volatile charge storage element 354 during the program operation may depend on the duration for which the program voltage is applied to the cell. The charge may be transported through charge transport element 350 by, for instance, direct tunneling through charge transport element 350. The charge can then be trapped and stored by the charge storage element to which it has been transported, and charge blocking element 356 can prevent the stored charge from leaking while it is being stored.

As an example, programming can be done by applying −Vpp on the gate of cell 346, which injects an electron(s) into the gate dielectric layers. The electron gets injected from the metal gate and almost instantly, the gate potential is transferred to the interfacing i-SRN materials 362-1 and 362-2. The i-SRN materials get flooded with electrons with direct tunneling of charges within that medium. As a result, the materials' conductivity is raised by many orders of magnitude, and it changes into a nearly conductive layer. The −Vpp without any significant potential drop gets transferred into the i-SRN materials. Thus, the i-SRN materials can act almost as an extension of the potential imposed on the gate and can provide silicon nanocrystals as injecting centers, injecting electrons into the gate dielectric. Subsequently, electrons tunnel through nitride materials 364-1 and 364-2 and HfLaON material 366, and get trapped into the shallower trapping centers in nitride material 352. As the programming proceeds, additional electrons get stored into the i-SRN material 368 between the nitride and GaN trapping materials 352 and 370, as well as into the deeper trap depths of GaN material 370. This accomplishes "writing" to the higher threshold state.

For erase operations, +Vpp may be applied to the gate, and band bending may be reversed. For instance, the trapped electrons tunnel back to the gate by direct tunneling when short pulses of +Vpp are applied to the gate. This can enable L2 functionality. With a longer pulse duration, charges trapped in GaN material 370 may get detrapped, aided by the adjacent i-SRN storage material 368. This can enable L3 functionality. The low EOT design and lower programming voltage thus provide simultaneously L2 and L3 functionality by storing charges respectively in nitride traps and GaN traps.

In an embodiment, simultaneous L2/L3/L4 functionality can be achieved by increasing the thickness of GaN material 370 to approximately 5-6 nm. For a longer programming pulse duration (e.g., L4 programming), traps of GaN material 370 further from the gate will be filled, whereas, for shorter pulse durations (e.g., L3 programming), only traps closer to the gate will be filled. A special pulse sequence for L3 programming comprising a −Vpp/+0.7 Vpp, storing part of the GaN charges in the in-SRN material closer to the gate, may be needed, but the L2 programming may remain unaffected. For increased performance of simultaneous L2/L3/L4 functionality, the nitride material 352 thickness and the adjacent i-SRN storage material 368 may need a thicker trap for the same i-SRN thickness with a thinner tunnel material.

Figure 4:
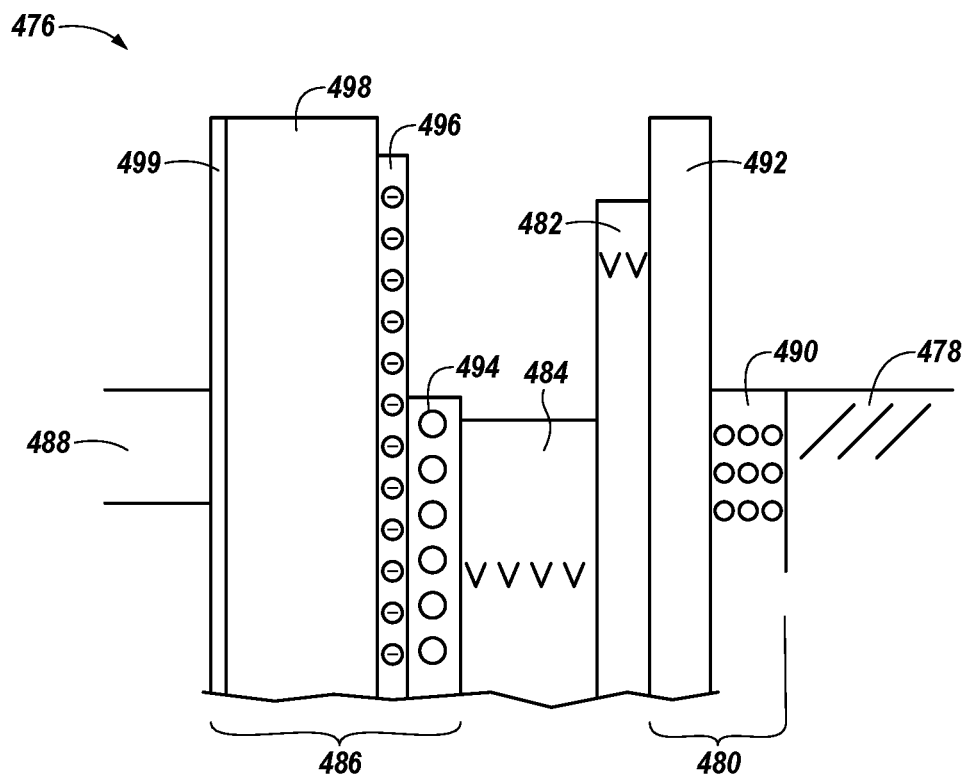
FIG. 4 illustrates a portion of a multifunctional memory cell in accordance with an embodiment of the present disclosure.

FIG. 4 illustrates a portion of a multifunctional memory cell 476 in accordance with an embodiment of the present disclosure, designed for low cost, low power, simultaneous L3 and L4-L5 functionality. For instance, dual trapping of nitride for L3 and GaN for L4-L5 can be used in the design illustrated in FIG. 4, and the low power may result from operability at Vpp=+/−5 V using enhanced charge injection into an HfSiON tunnel material (e.g., layer) from an i-SRN material. Further, the stack design may include dielectric materials such as OR—SiON and HfSiON for both charge transport (e.g., tunneling) and blocking, which may be implementable using low cost low-pressure chemical vapor deposition (LP-CVD) processing. Further, the stack design may utilize negative fixed charge associated with an $Al_2O_3$/i-SRN interface to establish a large memory window and longer retention for L4 functionality.

For example, FIG. 4 illustrates a partial energy band diagram of the gate stack structure of a reverse-mode multifunctional memory cell 476. Cell 476 can be, for instance, a six unique layer low cost, low power, memory cell that can provide both L3 and L4-L5 functionality, while consuming a relatively low amount of power during operation (e.g., during program and/or erase operations performed on the cell) and being cheap and/or easy to process (e.g., fabricate). In an embodiment, cell 476 can comprise a stack that includes a charge blocking element having an OR—SiON material, an HfSiON material, an $Al_2O_3$ material, and an i-SRN material, a GaN non-volatile charge storage element, a nitride less non-volatile charge storage element, and a charge transport (e.g., tunnel) element having an HfSiON material and an i-SRN material, as will be described herein.

As shown in FIG. 4, cell 476 can include a substrate element 488, a charge blocking element 486 adjacent (e.g., in direct contact with) substrate element 488, a non-volatile charge storage element 484 adjacent charge blocking element 486, a less non-volatile charge storage element 482 adjacent non-volatile charge storage element 484, a charge transport (e.g., tunneling) element 480 adjacent less non-volatile charge storage element 482, and a gate element 478 adjacent charge transport element 480. Substrate element 488 can be, for example, a silicon material, and gate element 478 can be an insulator-metal interface material (e.g., layer) such as, for instance, TaN or TiN.

Less non-volatile (e.g., DRAM) charge storage element 482 can be a nitride material, which can provide stability and a large retention window, while having a shallow trap depth to enhance detrapping and increase the speed of erase operations performed on cell 476. Non-volatile (e.g., flash) charge storage element 484 can be a GaN material, which can provide a high trapping density. GaN material 484 and nitride material 482 can have thicknesses of 4 nm and 2 nm, respectively, with a combined EOT of approximately 2.3 nm.

As shown in FIG. 4, charge blocking element 486 can include a first material 499, a second material 498, a third material 496, and a fourth material 494. First material 499 and second material 498 can be an OR—SiON material and a hafnium oxynitride material (e.g., HfSiON), respectively, having characteristics and benefits analogous to those previously described for charge blocking element 356 in connection with FIG. 3. OR—SiON material 499 and HfSiON material 498 can have thicknesses of 1 nm and 4.55 nm, respectively, with a combined EOT of 2.1 nm.

Third material 496 can be an $Al_2O_3$ material, and fourth material 494 can be a silicon-rich nitride (e.g., i-SRN) material. These materials can react at their mutual interface to provide a high density of fixed negative charge that can prevent charge loss to substrate 488 by creating a repulsive electro-static field. This can provide a very large memory window and retention for L4 functionality. $Al_2O_3$ material 496 and i-SRN material 494 can have thickness of 1 nm and 2 nm, respectively, with a combined EOT of approximately 1 nm.

In the example illustrated in FIG. 4, charge transport element 480 includes a first material 492 and a second material 490. First material 492 can be a hafnium oxynitride material (e.g., the same type of hafnium oxynitride material as material 498), and second material 490 be a silicon-rich nitride material (e.g., i-SRN). The transport of charge through charge transport element 480, and the benefits of utilizing such materials in charge transport element 480, will be further described herein. HfSiON material 492 can have a thickness of 2.5 nm, and i-SRN material 490 can have a thickness of 2 nm, with a combined EOT of approximately 1.3 nm for charge transport element 480.

The combined total EOT for the stack comprising charge blocking element 486, non-volatile and less non-volatile charge storage elements 484 and 482, and charge transport element 480 can be, for instance, less than or equal to 6.7 nm. This embodiment can be a low power (e.g., Vpp of +/−5 V, peak programming field of 7.5 MV/cm) design, as previously described. Further, all materials of the stack could be deposited with the same LP-CVD tool, in a manner analogous to that described in connection with FIG. 3.

During operation of cell 476, such as, for instance, during a program operation being performed on cell 476, a charge (e.g., an electron) may be transported from gate element 478 through charge transport element 480 (e.g., through materials 490 and 492) to either less non-volatile charge storage element 482 or non-volatile charge storage element 484. For instance, a program operation performed on cell 476 can include applying a program (e.g., write) voltage (+/−Vpp) to cell 476, and whether the charge is transported to less non-volatile charge storage element 482 or non-volatile charge storage element 484 during the program operation may depend on the duration for which the program voltage is applied to the cell. The charge may be transported through charge transport element 480 by, for instance, direct tunneling through charge transport element 480. The charge can then be trapped and stored by the charge storage element to which it has been transported, and charge blocking element 486 can prevent the stored charge from leaking while it is being stored.

As an example, programming can be done by applying −Vpp (e.g., −5 V) on the gate of cell 476, which injects an electron(s) into the gate dielectric layers and on to i-SRN material 490, in a manner analogous to that described in connection with FIG. 3. Subsequently, enhanced injection of the electrons from i-SRN material 490 into HfSiON material 492 can occur using the −5 V Vpp, which can allow for low power operability, as described herein, and the electrons may get trapped in storage materials 482 or 484, in a manner analogous to that described in connection with FIG. 3. For erase operations, +Vpp (e.g., +5 V) may be applied to the gate, band bending may be reversed, and the trapped electrons can tunnel back to the gate, in a manner analogous to that described in connection with FIG. 3.

Figure 5:
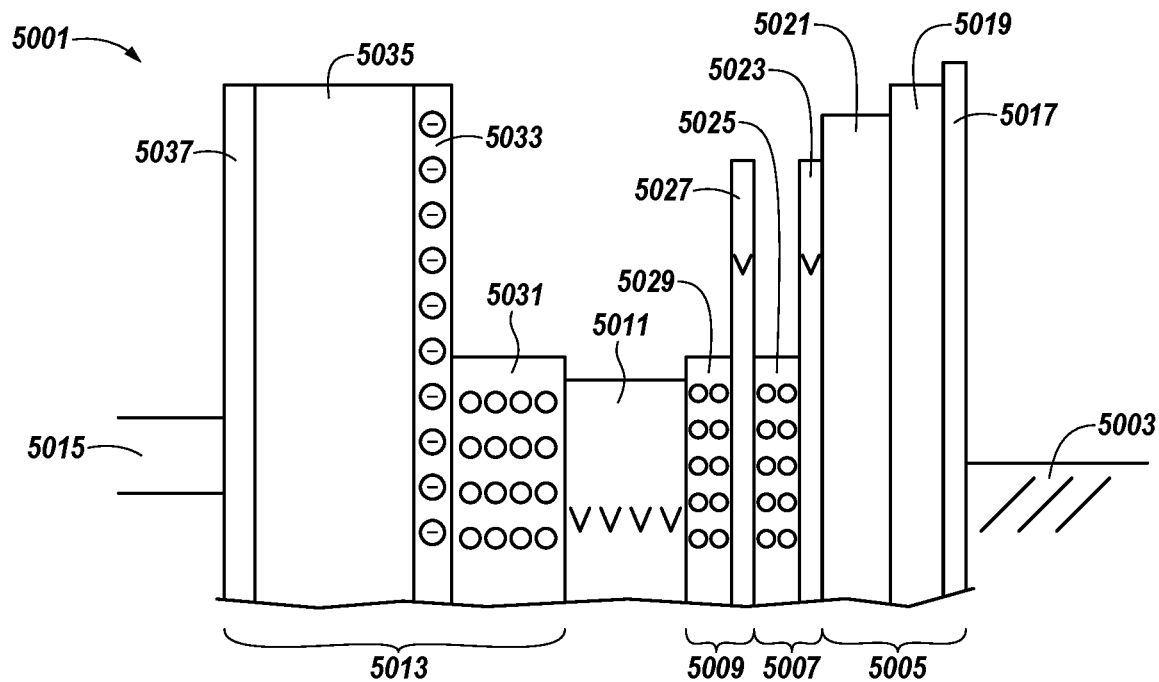
FIG. 5 illustrates a portion of a multifunctional memory cell in accordance with an embodiment of the present disclosure.

FIG. 5 illustrates a portion of a multifunctional memory cell 5001 in accordance with an embodiment of the present disclosure, designed for low cost, high performance, high capacity simultaneous L2, L3, and L4 functionality with DLC or TLC capability. For instance, the cell design illustrated in FIG. 5 may be implementable in both NROM VGA and NAND flash memory cells, operable at Vpp=+/−7 V with an EOT of approximately 8.5 nm for simultaneous functionality of L2/L3 and high capacity DLC or TLC L4 functionality. The cell design may include a progressive band offset (PBO) tunnel barrier that can achieve the low cost and high performance objective, and can combine elements of the cells previously described in connection with FIGS. 3 and 4 both for functionality and high capacity.

For example, FIG. 5 illustrates a partial energy band diagram of the gate stack structure of a reverse-mode multifunctional memory cell 5001. Cell 5001 can be, for instance, a seven unique layer low cost, high performance, high capacity memory cell that can provide simultaneous L2, L3, and L4 functionality with DLC or TLC capability, while being cheap and/or easy to process (e.g., fabricate) and performing at a high speed (e.g., having increased speeds for program and/or erase operations performed on the cell). In an embodiment, cell 5001 can comprise a stack that includes a charge blocking element having an OR—SiON material, an HfLaON material, an $Al_2O_3$ material, and an i-SRN material, a GaN non-volatile charge storage element, an additional non-volatile charge storage element having a nitride material and an i-SRN material, a less non-volatile charge storage element having a nitride material and an i-SRN material, and a charge transport (e.g., tunnel) element having a lanthanum oxide ($La_2O_3$) material, an HfLaON material, and an OR—SiON material, as will be described herein.

As shown in FIG. 5, cell 5001 can include a substrate element 5015, a charge blocking element 5013 adjacent (e.g., in direct contact with) substrate element 5015, a non-volatile charge storage element 5011 adjacent charge blocking element 5013, an additional non-volatile charge storage element 5009 adjacent non-volatile charge storage element 5011, a less non-volatile charge storage element 5007 adjacent additional non-volatile charge storage element 5009, a charge transport (e.g., tunneling) element 5005 adjacent less non-volatile charge storage element 5007, and a gate element 5003 adjacent charge transport element 5005. Substrate element 5015 can be, for example, a silicon material, and gate element 5003 can be an insulator-metal interface material (e.g., layer) such as, for instance, TaN or TiN.

As shown in FIG. 5, less non-volatile (e.g., DRAM) charge storage element 5007 can include a first material 5023 and a second material 5025. First material 5023 can be a nitride material that provides fast charge trapping and de-trapping for the DRAM functionality, as previously described herein. Second material 5025 can be a silicon-rich nitride material (e.g., i-SRN) to further enhance charge storage (e.g., the memory window) for the DRAM functionality. i-SRN material 5025 and nitride material 5023 can have thicknesses of 2 nm and 1 nm, respectively, with a combined EOT of approximately 1.15 nm.

As shown in FIG. 5, non-volatile (e.g., flash) charge storage element 5009 can include a first non-volatile charge storage material 5027, and a second non-volatile charge storage material 5029. First material 5027 can be a nitride material that provides provide deeper charge trapping, and therefore, greater stability and a larger retention window, for flash functionality, and second material 5029 can be a silicon-rich nitride material (e.g., i-SRN) to further enhance charge storage for the flash functionality. Further, non-volatile charge storage element 5011 can be a GaN material, which can provide a high trapping density for additional flash (e.g., L4) functionality. GaN material 5011, i-SRN material 5029, and nitride material 5027, can have thicknesses of 4 nm, 2 nm, and 1 nm, respectively, with a combined EOT of approximately 2.3 nm.

As shown in FIG. 5, charge blocking element 5013 can include a first material 5037, a second material 5035, a third material 5033, and a fourth material 5031. First material 5037 and second material 5035 can be an OR—SiON material and a hafnium oxynitride material (e.g., HfLaON), respectively, having characteristics and benefits analogous to those previously described for charge blocking element 356 in connection with FIG. 3. OR—SiON material 5037 and HfLaON material 5035 can have thicknesses of 1 nm and 5 nm, respectively, with a combined EOT of 1.8 nm.

Third material 5033 can be an $Al_2O_3$ material, and fourth material 5031 can be a silicon-rich nitride (e.g., i-SRN) material, having characteristics and benefits analogous to those previously described for charge blocking element 486 in connection with FIG. 4. $Al_2O_3$ material 5033 and i-SRN material 5031 can have thickness of 1 nm and 4 nm, respectively, with a combined EOT of approximately 1.54 nm.

In the example illustrated in FIG. 5, charge transport element 5005 includes a first material 5021, a second material 5019, and a third material 5017. First material 5021 can be an $La_2O_3$ material to enhance both electron and hole tunneling, providing lower band offset for hole tunneling. Second material 5019 can be a hafnium oxynitride material (e.g., the same type of hafnium oxynitride material as material 5035), and third material 5017 be an OR—SiON material that can provide interface stability with gate element 5003.

Utilizing such materials for first material 5021, second material 5019, and third material 5017 can increase the speed and efficiency of charge transport through charge transport element 5005 during program and/or erase operations (e.g., while an external field exists), while maintaining a low conductivity to prevent reverse transport of charge stored by charge storage elements 5007, 5009, and/or 5011 back through charge transport element 5005 (e.g., when the external field is removed). Further, utilizing $La_2O_3$ for first material 5021 can allow for both electron and hole tunneling, which can further increase the speed and efficiency of charge transport through charge transport element 5005 during program and/or erase operations. The transport of charge through charge transport element 5005 will be further described herein.

$La_2O_3$ material 5021 can have a thickness of 3 nm, HfLaON material 5019 can have a thickness of 2.5 nm, and OR—SiON material 5017 can have a thickness of 1 nm, with a combined EOT of approximately 1.7 nm for charge transport element 5005. Further, the combined total EOT for the stack comprising charge blocking element 5013, charge storage elements 5011, 5009, and 5007, and charge transport element 5005 can be, for instance, approximately 8.5 nm. The design of this embodiment can be operable at Vpp=+/−7 V, with a peak programming field of 8.2 MV/cm.

During operation of cell 5001, such as, for instance, during a program operation being performed on cell 476, a charge (e.g., an electron) may be transported from gate element 5003 through charge transport element 5005 (e.g., through materials 5017, 5019, and 5021) by enhanced direct tunneling (e.g., PBO DTM) to less non-volatile charge storage element 5007 (e.g., nitride material 5023), non-volatile charge storage element 5009 (e.g., nitride material 5027), or non-volatile charge storage element 5011. For instance, a program operation performed on cell 5005 can include applying a program (e.g., write) voltage (+/−Vpp) to cell 5005, and the charge storage element to which the charge is transported during the program operation may depend on the duration for which the program voltage is applied to the cell.

The charge may be transported through charge transport element 5005 by, for instance, tunneling through charge transport element 5005. For example, charge transport element 5005 can be a triple layer PBO tunnel barrier that can provide internal field-aided enhanced electron transport, and the charge may tunnel through the PBO tunnel barrier via direct electron tunneling or hole tunneling. The charge can then be trapped and stored by the charge storage element to which it has been transported, and charge blocking element 5013 can prevent the stored charge from leaking while it is being stored.

When the gate polarity is reversed for erasing, enhanced hole tunneling from the charge storage elements may take place through the above-mentioned direct tunnel (PBO-DTM for holes) barriers transporting holes to both the less non-volatile charge storage element 5007 and the non-volatile charge storage elements 5009 and 5011. Simultaneously, electrons from less non-volatile charge storage element 5007 and the non-volatile charge storage elements 5009 and 5011 may be detrapped, and either get compensated with incoming holes or tunnel back to gate element 5003. This may significantly reduce erase time and cycle time, enhancing performance.

Figure 6:
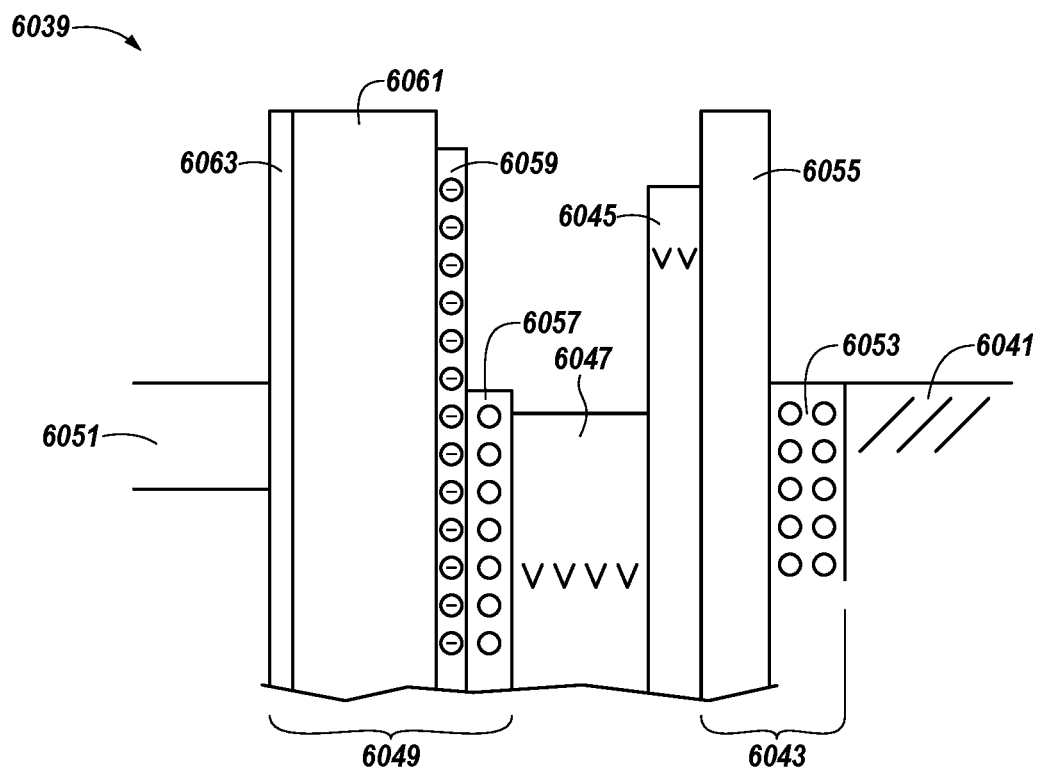
FIG. 6 illustrates a portion of a multifunctional memory cell in accordance with an embodiment of the present disclosure.

FIG. 6 illustrates a portion of a multifunctional memory cell 6039 in accordance with an embodiment of the present disclosure, designed for low cost, high capacity L2-L3 and L4-L5 (TLC) functionality. The design of memory cell 6039 illustrated in FIG. 6 may be similar to the cell design described in connection with FIG. 4, except the charge transport element may be a two-layer PBO tunnel barrier having an oxide material (e.g., $SiO_2$), and the charge blocking element may include an oxide material (e.g., instead of OR—SiON). The cell design illustrated in FIG. 6 may be operable at Vpp=+/−7 V, with an EOT of approximately 9.1 nm, for low cost, high capacity, and durability. The cell design may have a large memory window, which may provide TLC capability. Although the L2 functionality may be relatively slower, the L4-L5 functionality may be accentuated by the large memory window and enhanced charge retention.

For example, FIG. 6 illustrates a partial energy band diagram of the gate stack structure of a reverse-mode multifunctional memory cell 6039. Cell 6039 can be, for instance, a six unique layer low cost, high capacity memory cell that can provide both L2-L3 and L4-L5 functionality, while being cheap and/or easy to process (e.g., fabricate). In an embodiment, cell 476 can comprise a stack that includes a charge blocking element having an oxide material, an HfSiON material, an $Al_2O_3$ material, and an i-SRN material, a GaN non-volatile charge storage element, a nitride less non-volatile charge storage element, and a charge transport (e.g., tunnel) element having an HfSiON material and an oxide material, as will be described herein.

As shown in FIG. 6, cell 6039 can include a substrate element 6051, a charge blocking element 6049 adjacent (e.g., in direct contact with) substrate element 6051, a non-volatile charge storage element 6047 adjacent charge blocking element 6051, a less non-volatile charge storage element 6045 adjacent non-volatile charge storage element 6047, a charge transport (e.g., tunneling) element 6043 adjacent less non-volatile charge storage element 6045, and a gate element 6041 adjacent charge transport element 6043. Substrate element 6051 can be, for example, a silicon material, and gate element 6041 can be an insulator-metal interface material (e.g., layer) such as, for instance, TaN or TiN.

Less non-volatile (e.g., DRAM) charge storage element 6045 can be a nitride material, and non-volatile (e.g., flash) charge storage element 6047 can be a GaN material, which can both have characteristics and benefits analogous to those previously described in connection with FIG. 4. GaN material 6047 and nitride material 6045 can have thicknesses of 5 nm and 2 nm, respectively, with a combined EOT of approximately 2.6 nm.

As shown in FIG. 6, charge blocking element 6049 can include a first material 6063, a second material 6061, a third material 6059, and a fourth material 6057. First material 6063 can be an oxide material, and second material 6061 can be a hafnium oxynitride material (e.g., HfSiON). Oxide material 6063 and HfSiON material 6061 can have thicknesses of 1 nm and 4.5 nm, respectively, with a combined EOT of 2.3 nm.

Third material 6059 can be an $Al_2O_3$ material, and fourth material 6057 can be a silicon-rich nitride (e.g., i-SRN) material, which can both have characteristics and benefits analogous to those previously described in connection with FIG. 4. $Al_2O_3$ material 6059 and i-SRN material 6057 can have thickness of 2 nm and 4 nm, respectively, with a combined EOT of approximately 2 nm.

In the example illustrated in FIG. 6, charge transport element 6043 includes a first material 6055 and a second material 6053. First material 6055 can be a hafnium oxynitride material (e.g., the same type of hafnium oxynitride material as material 6061) having characteristics and benefits analogous to those previously described in connection with FIG. 4, and second material 6053 be an oxide material such as, for instance, $SiO_2$. HfSiON material 6055 can have a thickness of 2.5 nm, and oxide material 6053 can have a thickness of 1.5 nm, with a combined EOT of approximately 2.2 nm for charge transport element 6043.

During operation of cell 6039, such as, for instance, during a program operation being performed on cell 6039, a charge (e.g., an electron) may be transported from gate element 6041 through charge transport element 6043 (e.g., through materials 6053 and 6055) by enhanced direct tunneling (e.g., PBO DTM) to less non-volatile charge storage element 6045 or non-volatile charge storage element 6047. For instance, a program operation performed on cell 6039 can include applying a program (e.g., write) voltage (+/−Vpp) to cell 6039, and the charge storage element to which the charge is transported during the program operation may depend on the duration for which the program voltage is applied to the cell.

The charge may be transported through charge transport element 6043 by, for instance, tunneling through charge transport element 6043. For example, charge transport element 6043 can be a double layer PBO tunnel barrier that can provide internal field-aided enhanced electron transport, and the charge may tunnel through the PBO tunnel barrier via direct electron tunneling. The charge can then be trapped and stored by the charge storage element to which it has been transported, and charge blocking element 6049 can prevent the stored charge from leaking while it is being stored. When the gate polarity is reversed for erasing, enhanced tunneling of the charges from the charge storage elements may take place through the above-mentioned direct tunnel (PBO-DTM) barriers back to gate element 6041.

One characteristic of reverse-mode MSUM cell designs described herein is the application of multiple trapping dielectric materials with intrinsic trapping properties of trap density (often expressed in terms of capture probability) and trap energy depth and placement of such materials with reference to the charge sources, (e.g., the gate) and the semiconductor substrate (e.g., silicon) of the NVM gate stack design. Well characterized trapping dielectric (e.g., nitride) along with deep offset trapping dielectric (e.g., GaN) have been used and placed appropriately in the reverse-mode MSUM cell designs to achieve simultaneous multi-functionality with desirable performance in the reverse-mode MSUM device illustrations discussed earlier. The significance of specific reverse-mode MSUM cell stack design to efficiently inject and store charges deriving appropriate memory properties (e.g., window, retention, endurance, durability, MLC-capability, multi-functionality) has been described herein. By placing multiple trapping dielectric materials with different trapping properties at variable distances from charge sources, a variable functionality with variable performance could be achieved, which can be tuned to pulsing schemes [(+/−Vpp) and pulse durations)] to achieve simultaneously desired multi-functionality and performance characteristics for the reverse-mode MSUM cell. The following cell design addresses such a reverse-mode MSUM design by incorporating ultra-thin film laminates of inter-combed nitride and i-SRN materials placed between the tunneling layers and the blocking layer (or layers) for the reverse-mode MSUM cell stack design. The scheme could be extended to incorporate triple-material laminates comprising inter-combed trapping storage layers of, for instance, i-SRN (storage), nitride (shallower trap), and GaN (deeper trap) to achieve various design objections and multifunctionality. Many variations of such scheme are possible but will not be specifically illustrated here. A singular example will be described herein in connection with FIG. 7.

Figure 7:
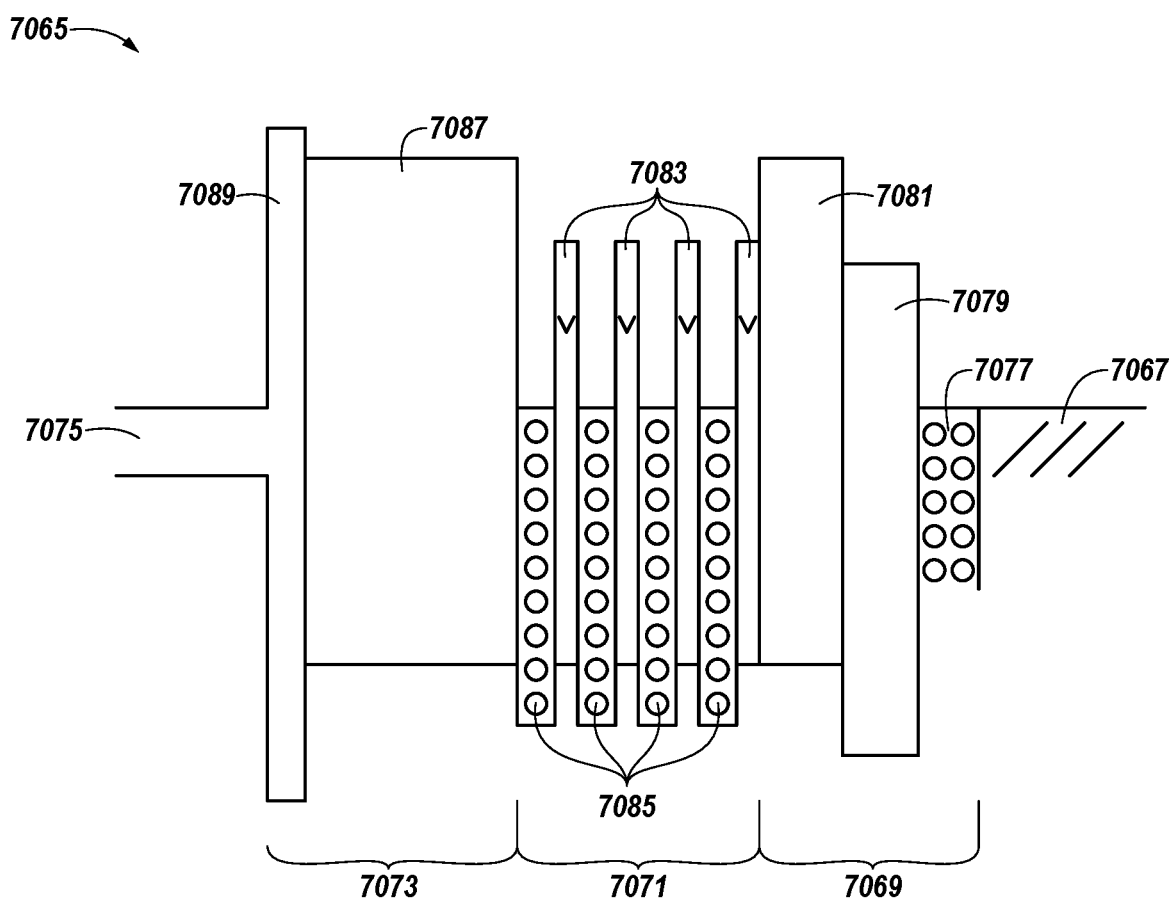
FIG. 7 illustrates a portion of a multifunctional memory cell in accordance with an embodiment of the present disclosure.

FIG. 7 illustrates a portion of a multifunctional memory cell 7065 in accordance with an embodiment of the present disclosure. For example, FIG. 7 illustrates a stack design concept for a variable (e.g., L2-L3 and L4) functionality, variable performance reverse-mode MSUM design comprising multiple layering of two materials (e.g., nitride with a shallower trap, and i-SRN) adjacent to each other as intercombed laminates in the form of a partial energy band diagram.

The stack design illustrated in FIG. 7 can be an extension of the memory cell designs previously described in connection with FIGS. 5 and 6. For example, a two or three-layer PBO barrier can be combined with extended trapping laminations of successive thin (e.g., 1-2 nm thick) layers of nitride or $Si_2ON_2$ paired with i-SRN, with at least three pairs of trapping-storage layer designs for variable L2-L3 functionality. Since the trapping storage distances for the relatively shallower traps of the nitride material (e.g., as compared to GaN) would vary, the performance of L2 and L3 designs can be varied for different applications, power, and/or performance. Stack structures for both Vpp=+/−5 V and +/−7 V could be achieved by using the appropriate number of pairs of trap-storage laminates in the design, and such designs may (or may not) incorporate L4-L5 MLC capabilities. The stack design illustrated in FIG. 7 can comprise four pairs of nitride (or $Si_2ON_2$) and i-SRN layers, each 1.5 nm thick, with L4 SLC operability at Vpp=+/−7 V and relatively higher performing variable performance L2-L3 functionality without deep-offset trapping.

Cell 7065 can comprise, for example, a triple-layered tunneling design 7069, with multiple pairs of nitride-i-SRN laminates 7071 for charge storage placed between charge transport element 7069 and charge blocking element 7073. By trapping and storing charges at different locations and detrapping such charges through a write-erase pulsing scheme, different functionality and associated performance such as L2-L3 and L4 SLC or MLC functionality can be simultaneously achieved.

In the example shown in FIG. 7, a three-layered direct tunneling PBO barrier 7069 is illustrated, comprising a silicon-rich nitride material (e.g., i-SRN) 7077, an $HfO_2$ material 7079, and a hafnium oxynitride material (e.g., HfLaON) 7081. The charge storage design 7071 illustrated comprises, for example, four pairs of thin laminates, each comprising nitride material 7083 and silicon-rich nitride material (e.g., i-SRN) 7085. The charge blocking element 7073 comprises a thicker layer of the thermally stable, low leakage HfLaON material 7087 adjacent to 7017, and a thin layer of $SiO_2$ material 7089, to provide for simultaneous storage of at least 3 bits for multilevel memory (e.g., 8 memory states for TLC memory) with L2, L3, and L4 functionality.

As shown in FIG. 7, cell 7065 can include a substrate element 7075 adjacent (e.g., in direct contact with) charge blocking element 7073, charge storage element 7071 adjacent charge blocking element 7073, charge transport (e.g., tunneling) element 7069 adjacent charge storage element 7071, and a gate element 7067 adjacent charge transport element 7069. Substrate element 7075 can be, for example, a silicon material, and gate element 7067 can be an insulator-metal interface material such as, for instance, TaN or TiN.

As shown in FIG. 7, charge storage element 7071 can include a number of alternating nitride materials 7083 and i-SRN materials 7085 corresponding to different memory levels. For instance, charge storage element 7071 can include a first nitride material adjacent charge transport element 7069, a first i-SRN material adjacent the first nitride material, a second nitride material adjacent the first i-SRN material, a second i-SRN material adjacent the second nitride material, and so on. Utilizing nitride and i-SRN materials in charge storage element 1269 can have benefits analogous to those previously described herein.

In the example illustrated in FIG. 7, charge transport element 7069 includes a first material 7077, a second material 7079, and a third material 7081. First material 7077 can be an i-SRN material, second material 7079 can be an $HfO_2$ material, and third material 7081 can be a hafnium oxynitride material (e.g., the same hafnium oxynitride material as 7087). Utilizing such materials in charge transport element 7069 (e.g., as a direct tunneling PBO barrier) can have benefits analogous to those previously described herein.

During operation of cell 7065, such as, for instance, during a program operation being performed on cell 7065, a charge (e.g., electron) may be transported from gate element 7067 through charge transport element 7069 (e.g., through first material 7077, second material 7079, and third material 7081) to one of the nitride materials 7083 of charge storage element 7071. The charge may be transported through charge transport element 1268 by, for instance, direct tunneling through charge transport element 7069, in a manner analogous to that previously described herein.

As an example, a program operation performed on cell 7065 can include applying a program (e.g., write) voltage to cell 7065, and which nitride material 7083 (e.g., which memory level) the charge is transported to during the program operation may depend on the duration for which the program voltage and duration of the program pulse is applied to the cell. The charge can then be trapped and stored in the material (e.g. level) to which it is transported. For erasing, the program potential and pulse characteristics at the gate would be reversed for de-trapping the charges. The programming and erasing for different levels may be fast from trapping and de-trapping from the nitride materials at tunnel distances closest to gate element 7067, and may be successively longer from trapping and de-trapping at increasing tunnel distances.

Figure 8:
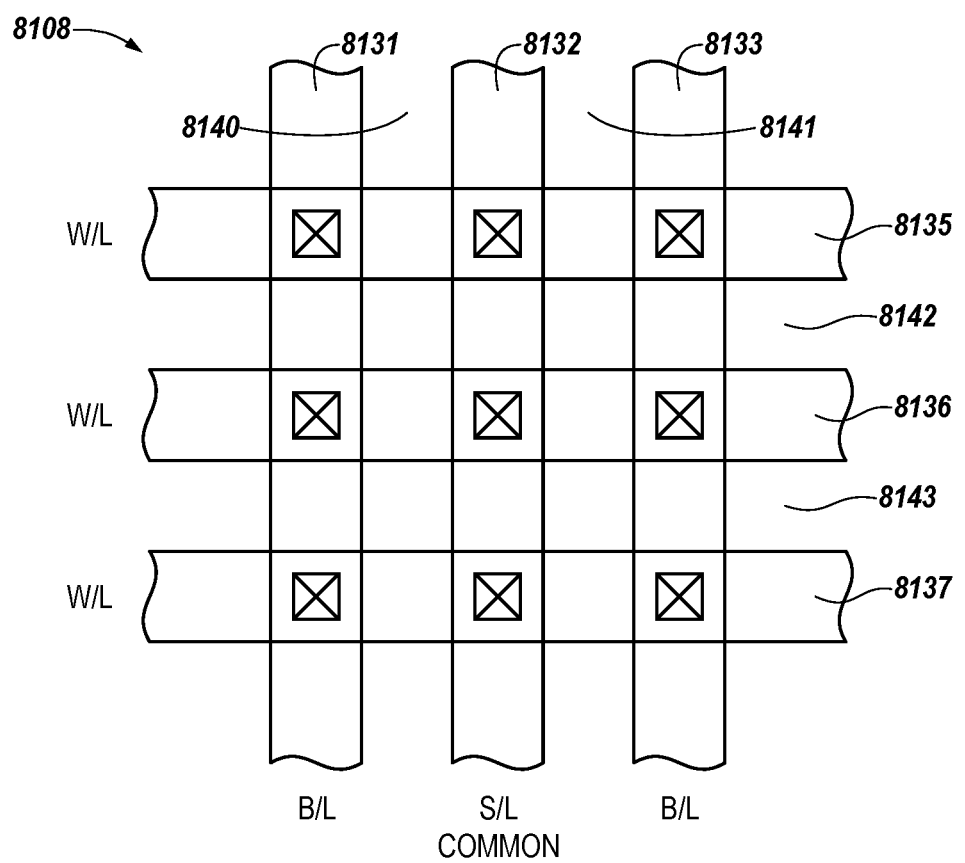
FIG. 8 illustrates a memory array having multifunctional memory cells in accordance with an embodiment of the present disclosure.

FIG. 8 illustrates a memory array 8108 having multifunctional memory cells in accordance with an embodiment of the present disclosure. For instance, array 8108 can include reverse-mode multifunctional memory cells previously described herein in connection with any of FIGS. 3-7. Array 8108 can be, for instance, a three-dimensional array in which the multifunctional memory cells are vertically stacked, planar multifunctional memory cells.

As shown in FIG. 8, array 8108 can include access (e.g., word) lines 8135-8137 that extend in the x-direction, and data (e.g., bit) lines 8131-8133 that extend substantially perpendicular in the y-direction. A multifunctional memory cell in accordance with the present disclosure can be located at the intersection of each respective word line and bit line, as illustrated in FIG. 8.

Isolation areas 8140, 8141 can be formed between the bit lines 8131, 8132 and 8132, 8133, respectively, while isolation areas 8142, 8143 can be formed between the word lines 8135, 8136 and 8136, 8137, respectively. A common source line can be formed in the memory array and commonly coupled to the bit lines 8131, 8133 for devices on either side (left or right).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory cell, comprising:
a gate element;
a first charge storage element; and
a second charge storage element;
wherein:
the gate element is configured to transport a first charge therefrom to the first charge storage element and transport a second charge therefrom to the second charge storage element;
the first charge storage element is configured to transport the first charge therefrom to the gate element; and
the second charge storage element is configured to transport the second charge therefrom to the gate element.

2. The memory cell of claim 1, wherein the first charge storage element includes a nitride material.

3. The memory cell of claim 1, wherein the first charge storage element includes a silicon-rich nitride material.

4. The memory cell of claim 1, wherein the second charge storage element includes a gallium nitride material.

5. The memory cell of claim 1, wherein:
the memory cell includes a charge transport element;
the gate element is configured to transport the first charge therefrom to the first charge storage element through the charge transport element; and
the gate element is configured to transport the second charge therefrom to the second charge storage element through the charge transport element.

6. The memory cell of claim 1, wherein:
the transport of the first charge from the first charge storage element to the gate element includes a direct tunneling of the first charge to the gate element; and
the transport of the second charge from the second charge storage element to the gate element includes a direct tunneling of the second charge to the gate element.

7. The memory cell of claim 1, wherein the memory cell includes a charge blocking element configured to prevent leakage of the first charge from the first charge storage element and prevent leakage of the second charge from the second charge storage element.

8. A method of operating a memory cell, comprising:
transporting a first charge from a gate element of the memory cell to a first charge storage element of the memory cell;
transporting a second charge from the gate element to a second charge storage element of the memory cell;
transporting the first charge from the first charge storage element to the gate element; and
transporting the second charge from the second charge storage element to the gate element.

9. The method of claim 8, wherein the method includes transporting the first charge from the first charge storage element to the gate element subsequent to transporting the first charge from the gate element to the first charge storage element.

10. The method of claim 8, wherein the method includes transporting the second charge from the second charge storage element to the gate element subsequent to transporting the second charge from the gate element to the second charge storage element.

11. The method of claim 8, wherein the method includes transporting the first charge from the first charge storage element through a charge transport element of the memory cell to the gate element.

12. The method of claim 8, wherein the method includes transporting the second charge from the second charge storage element through a charge transport element of the memory cell to the gate element.

13. The method of claim 8, wherein the method includes transporting the first charge from the first charge storage element to the gate element and transporting the second charge from the second charge storage element to the gate element during an erase operation being performed on the memory cell.

14. The method of claim 8, wherein the method includes:
transporting the first charge from the gate element to the first charge storage element and transporting the second charge from the gate element to the second charge storage element upon a voltage having a first polarity being applied to the gate element; and
transporting the first charge from the first charge storage element to the gate element and transporting the second charge from the second charge storage element to the gate element upon a voltage having a second polarity that is opposite the first polarity being applied to the gate element.

15. A memory cell, comprising:
a gate element;
a volatile charge storage element; and
a non-volatile charge storage element;
wherein:
the gate element is configured to transport a first charge therefrom to the volatile charge storage element and transport a second charge therefrom to the non-volatile charge storage element;
the volatile charge storage element is configured to transport the first charge therefrom to the gate element; and
the non-volatile charge storage element is configured to transport the second charge therefrom to the gate element.

16. The memory cell of claim 15, wherein the gate element is configured to transport the first charge therefrom to the volatile charge storage element and transport the second charge therefrom to the non-volatile charge storage element upon a negative voltage being applied to the gate element.

17. The memory cell of claim 15, wherein the volatile charge storage element is configured to transport the first charge therefrom to the gate element and the non-volatile charge storage element is configured to transport the second charge therefrom to the gate element upon a positive voltage being applied to the gate element.

18. The memory cell of claim 15, wherein:
the gate element is configured to transport the first charge therefrom to the volatile charge storage element upon a voltage being applied to the gate element for a first duration; and
the gate element is configured to transport the second charge therefrom to the non-volatile charge storage element upon a voltage being applied to the gate element for a second duration that is longer than the first duration.

19. The memory cell of claim 15, wherein:
the volatile charge storage element is configured to transport the first charge therefrom to the gate element upon a voltage being applied to the gate element for a first duration; and
the non-volatile charge storage element is configured to transport the second charge therefrom to the gate element upon a voltage being applied to the gate element for a second duration that is longer than the first duration.

20. The memory cell of claim 15, wherein:
the first charge is a first electron; and
the second charge is a second electron.

* * * * *